(12) United States Patent
Ryan et al.

(10) Patent No.: US 10,152,032 B2
(45) Date of Patent: Dec. 11, 2018

(54) SYSTEM AND METHOD FOR CONTROLLING AND MONITORING ENVIRONMENTAL CONDITIONS IN A BUILDING USING AN INTEGRATED RACK

(71) Applicant: Siemens Industry, Inc., Alpharetta, GA (US)

(72) Inventors: Douglas Ryan, Hingham, MA (US); John A. Hendrix, Jr., Grayslake, IL (US); Michael S. Schuler, Lockport, IL (US); Chad Jason Walker, Wichita, KS (US)

(73) Assignee: Siemens Industry, Inc., Alpharetta, GA (US)

( * ) Notice: Subject to any disclaimer, the term of this patent is extended or adjusted under 35 U.S.C. 154(b) by 358 days.

(21) Appl. No.: 15/241,791

(22) Filed: Aug. 19, 2016

(65) Prior Publication Data

US 2018/0052429 A1    Feb. 22, 2018

(51) Int. Cl.
*G05B 11/01* (2006.01)
*F24F 11/30* (2018.01)
(Continued)

(52) U.S. Cl.
CPC .............. *G05B 11/01* (2013.01); *F24F 11/30* (2018.01); *G05B 19/042* (2013.01); *G05D 23/00* (2013.01);
(Continued)

(58) Field of Classification Search
CPC ........ G05B 11/01; G05B 19/042; H05K 7/18; H05K 7/1467
See application file for complete search history.

(56) References Cited

U.S. PATENT DOCUMENTS 5,966,648 A * 10/1999 Ortberg ................ H05K 7/1425
                                                        361/752
6,195,493 B1 * 2/2001 Bridges ................ G02B 6/4452
                                                        385/134

(Continued)

FOREIGN PATENT DOCUMENTS

EP           0001377 A1    4/1979

*Primary Examiner* — Douglas Menz

(57) ABSTRACT

A system and method is provided that facilitates controlling and monitoring environmental conditions in buildings. The system may include at least one rack including: a plurality of slidable field panels mounted in a housing. The slidable field panels may be in side-by-side relation in a horizontal direction and may be configured to independently slide at least partially out of a front side opening of the housing via a plurality of slides. The slidable field panels may include a plurality of components mounted to vertical walls thereof, including: transformers and building control modules. The rack may also include a terminal panel including a plurality of connection terminals facing a back side opening of the housing. The connection terminals may be respectively wired to respective terminals of the transformers and building control. The system may include at least one data processing system including at least one processor configured to communicate with the building control modules to cause the rack when a heating, ventilating, and air conditioning (HVAC) system is wired to at least some of the connection terminals, to monitor and control the HVAC.

20 Claims, 17 Drawing Sheets

(51) Int. Cl.
    *G05B 19/042*     (2006.01)
    *H05K 7/18*     (2006.01)
    *G05D 23/00*     (2006.01)
    *H05K 7/14*     (2006.01)
    *F24F 120/20*     (2018.01)
    *F24F 110/00*     (2018.01)

(52) U.S. Cl.
    CPC ............. *H05K 7/1467* (2013.01); *H05K 7/18* (2013.01); *F24F 2110/00* (2018.01); *F24F 2120/20* (2018.01); *G05B 2219/25011* (2013.01); *G05B 2219/2614* (2013.01)

(56) References Cited

U.S. PATENT DOCUMENTS

| | | | |
|---|---|---|---|
| 9,301,025 B2 * | 3/2016 | Kioski | .................... H04Q 1/15 |
| 9,572,276 B2 | 2/2017 | Haroun et al. | |
| 2002/0181896 A1 | 12/2002 | Mcclellan et al. | |
| 2010/0082178 A1 | 4/2010 | Dawson et al. | |
| 2014/0018940 A1 | 1/2014 | Casilli et al. | |

* cited by examiner

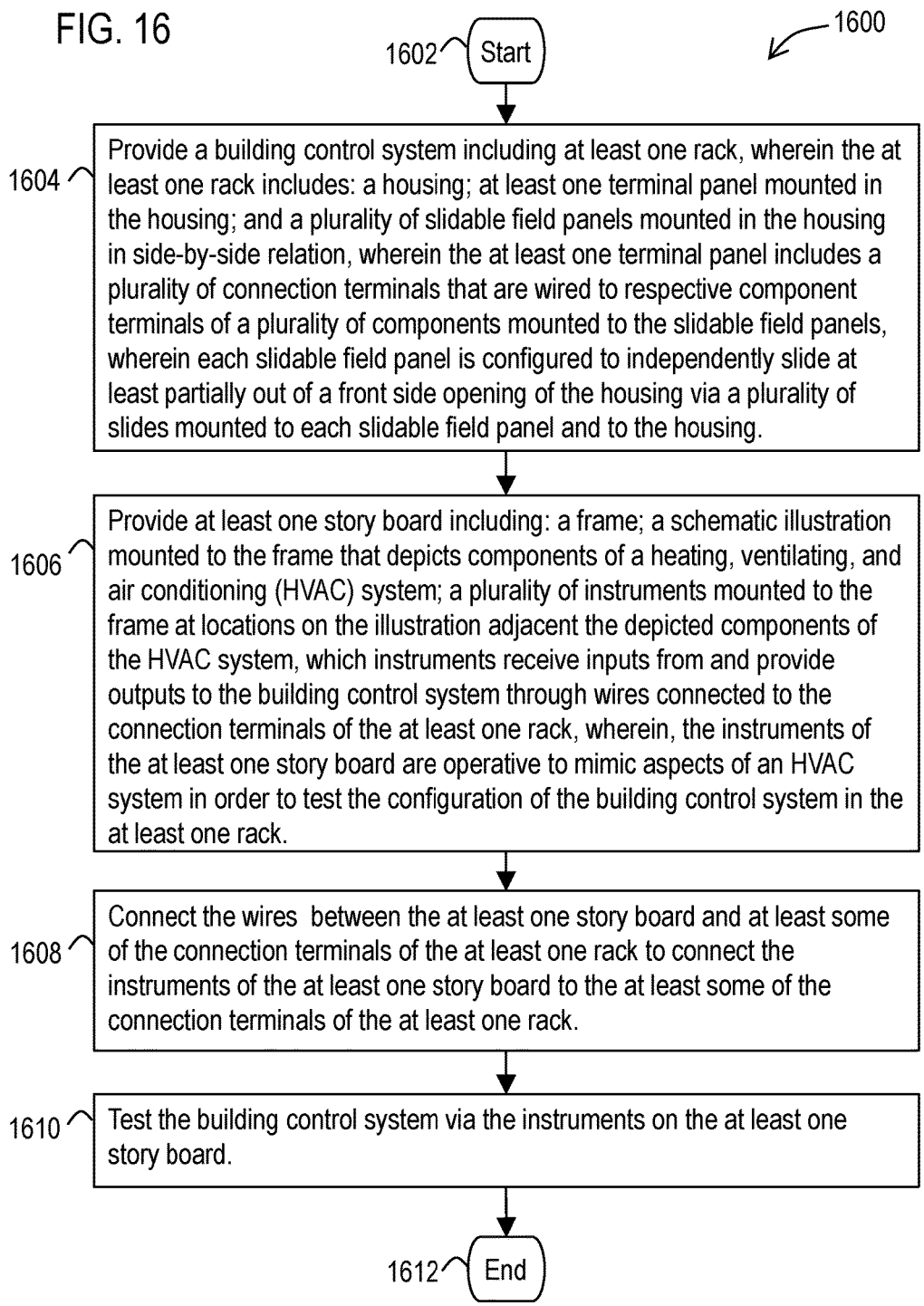

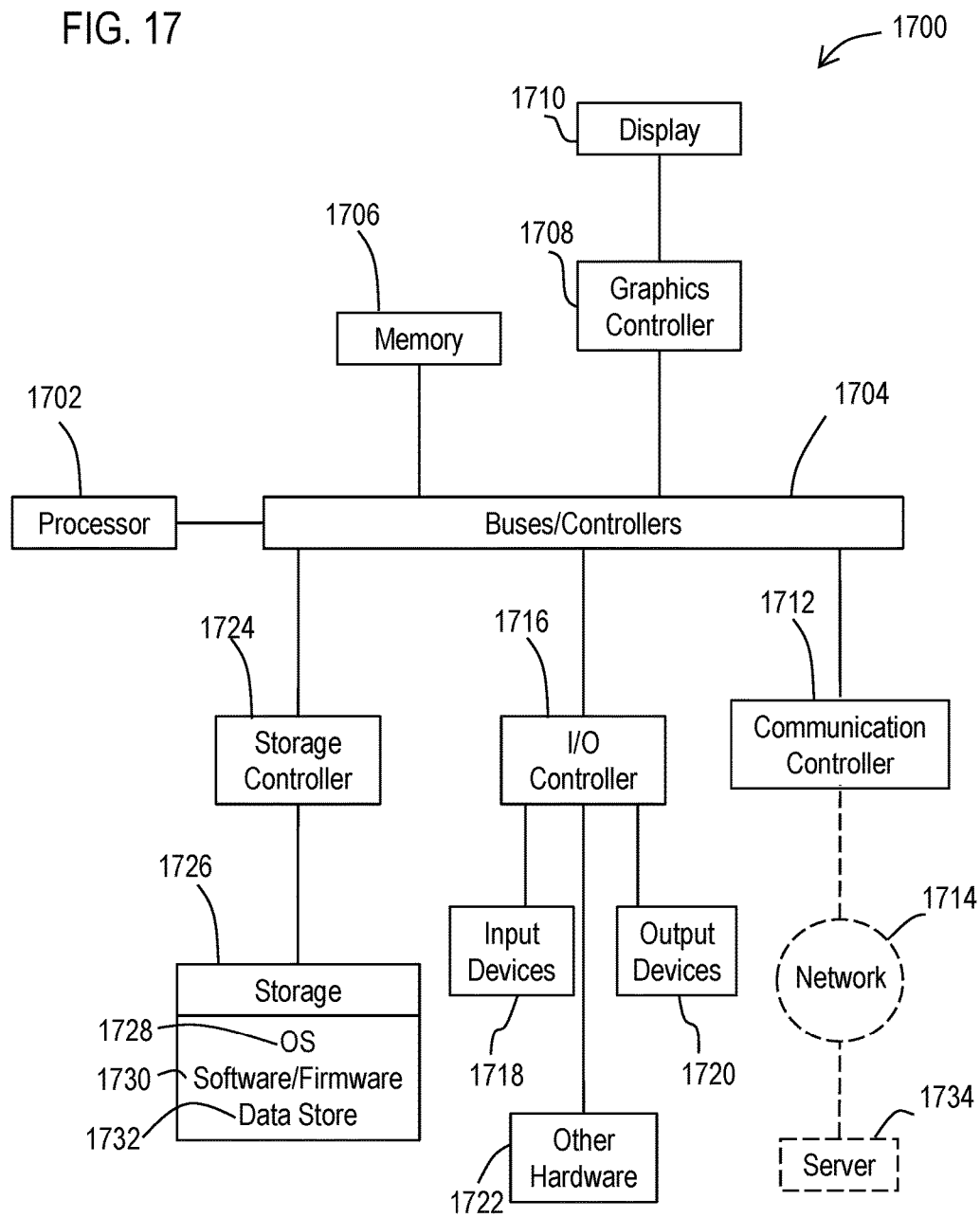

SYSTEM AND METHOD FOR CONTROLLING AND MONITORING ENVIRONMENTAL CONDITIONS IN A BUILDING USING AN INTEGRATED RACK

TECHNICAL FIELD

The present disclosure is directed, in general, to building technology, and in particular to building systems that control and monitor environmental conditions in buildings.

BACKGROUND

Building systems may be used to control and monitor environmental conditions in buildings. Such building systems may benefit from improvements.

SUMMARY

Variously disclosed embodiments comprise a building system and method that includes an integrated rack that may be used to facilitate controlling and monitoring environmental conditions in a building. In one example, a building control system may comprise a rack including: a housing including a front side opening and a back side opening. The rack may also include a plurality of slidable field panels mounted in the housing in side-by-side relation in a horizontal direction. Each slidable field panel may include a vertical wall and each slidable field panel may be configured to independently slide at least partially out of the front side opening via a plurality of slides mounted to each slidable field panel and to the housing. The rack may also include a plurality of components. Each vertical wall of each slidable field panel may include one or more of the components mounted thereto. The components may include a plurality of transformers, each including a plurality of terminals; and a plurality of building control modules. The building control modules may include a plurality of controller modules in operable connection with a plurality of relays and a plurality of input and/or output (I/O) modules. Each relay and each I/O module may include a plurality of terminals. In addition, the rack may include at least one terminal panel including a plurality of connection terminals facing the back side opening. The connection terminals may be respectively wired to respective terminals of the relays, transformers, and I/O modules mounted to the slidable field panels.

In another example, a method for controlling and monitoring environmental conditions in a building may comprise providing a rack having the features described previously with respect to the building control system.

In another example, a testing system for testing a building control system that controls and monitors environmental conditions in a building may comprise a building control system including at least one rack. The at least one rack may include: a housing; at least one terminal panel mounted in the housing; and a plurality of slidable field panels mounted in the housing in side-by-side relation. The at least one terminal panel may include a plurality of connection terminals that are wired to respective component terminals of a plurality of components mounted to the slidable field panels. Each slidable field panel may be configured to independently slide at least partially out of a front side opening of the housing via a plurality of slides mounted to each slidable field panel and to the housing. The testing system may also include at least one story board including a frame and a schematic illustration mounted to the frame that depicts components of a HVAC system. The story board may also include a plurality of instruments mounted to the frame at locations on the illustration adjacent the depicted components of the HVAC system. The instruments may receive inputs from and provide outputs to the building control system through wires connected to the connection terminals of the at least one rack. The instruments of the at least one story board may be operative to mimic aspects of an HVAC system in order to test the configuration of the building control system in at least one rack.

In another example, a method for testing a building control system that controls and monitors environmental conditions in a building may comprise providing a building control system and a story board such as described for the testing system. The method may also include connecting wires between the at least one story board and at least some of the connection terminals of the at least one rack to connect the instruments of the at least one story board to the at least some of the connection terminals of the at least one rack. Also the method may include testing the building control system via the instruments on the at least one story board.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

FIG. 16 illustrates a further flow diagram of an example methodology that facilitates testing the rack with a story board.

FIG. 17 illustrates a block diagram of a data processing system in which an embodiment may be implemented.

DETAILED DESCRIPTION

Figure 1:
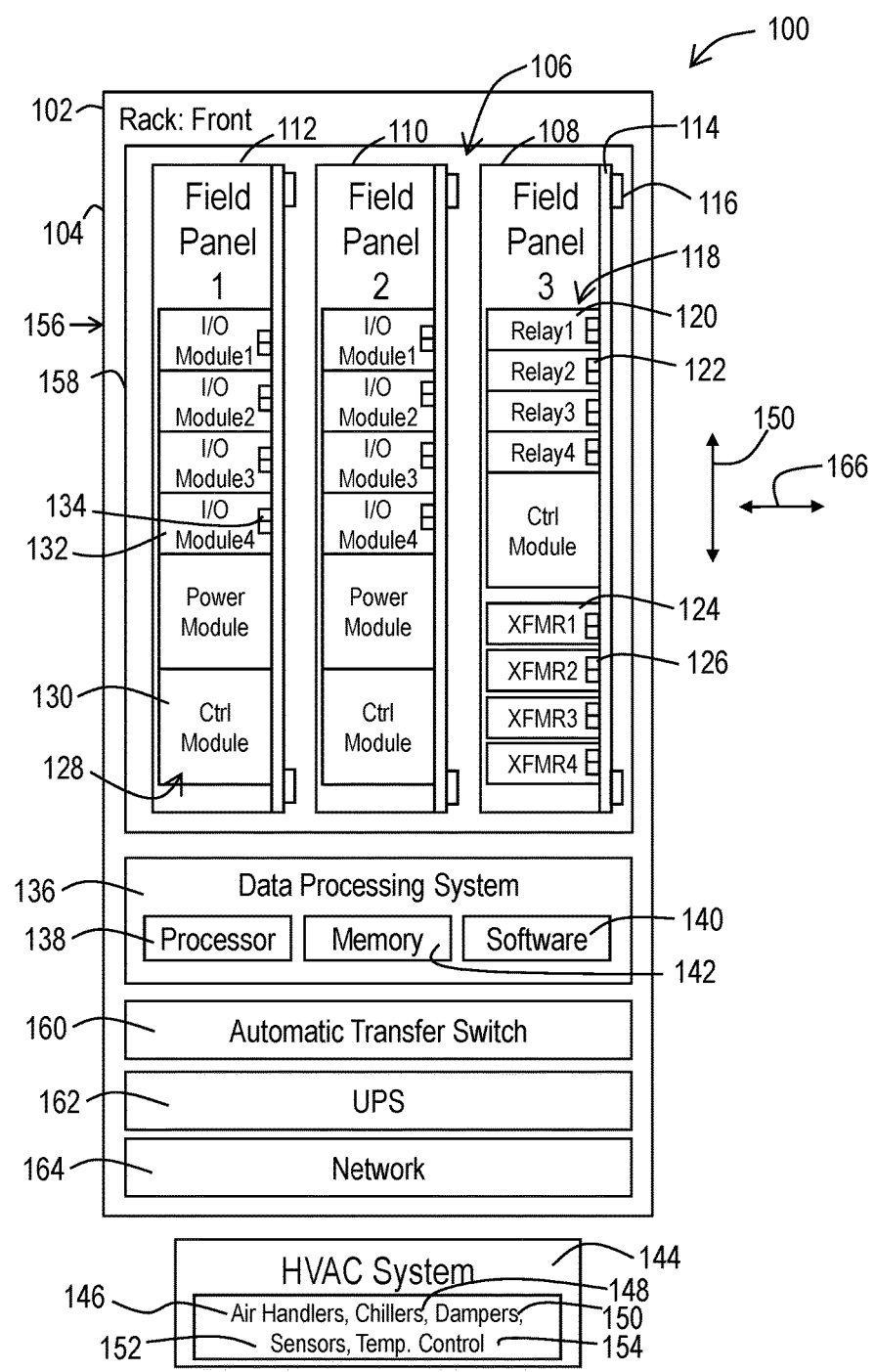
FIG. 1 illustrates a functional block diagram of an example system showing an example front side of a rack that facilitates controlling and monitoring environmental conditions.

Various technologies that pertain to systems and methods that facilitate controlling and monitoring environmental conditions with an integrated rack as well as testing the rack will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

With reference to FIG. 1, an example system 100 is illustrated that facilitates controlling and monitoring environmental conditions with an integrated rack. The system may include and/or correspond to a building control system that comprises at least one rack 102. The rack may include a housing 104 including a front side opening 106 and a back side opening 202 (shown in FIG. 2). In general the housing may have a generally block shape that is elongated in a vertical direction 150. The housing may include a metal frame 156 with side exterior panels mounted thereto that cover a plurality of elements mounted inside the housing. An example of a housing that may be used in example embodiments includes a 42U 19-inch server rack cabinet with lockable front and back doors. For example, in one example, the rack may correspond to a DCE42812 42U 19 inch rack cabinet (that is 78 inches high, 31.5 inches wide, and 47 inches depth), provided by Emerson Network Power of Columbus, Ohio. However, it should be appreciated that alternative embodiments may use smaller or larger server rack cabinets, and/or any other form factor of a housing that has sufficient interior size to mount the elements described herein.

The rack 102 may further include a plurality of slidable field panels 108, 110, 112 mounted in the housing in side-by-side relation in a horizontal direction 166. Each slidable field panel may include a metal vertical wall 114, which in some examples may be a perforated wall to facilitate cooling. Each slidable field panel may be configured to independently slide at least partially out of the front side opening via a plurality of slides 116 mounted to each slidable field panel and to the housing.

Slides may correspond to sliding mechanisms which provide both support and relative movement between objects by having at least one movable member slide relative to at least one other member. For example, the described embodiments may use a pair of ball bearing drawer slides side mounted in spaced apart relation in a vertical direction, between a vertical wall 114 of each slidable field panel and the frame of the housing or other enclosure/bracket mounted in the housing. Such slides may telescopically elongate to enable each slidable field panel to slide relative to the housing for a relative displacement of 20-30 inches (or other distance depending on the slides used, the width of each slidable field panel, and the available depth of the housing). However, it should be understood that alternative embodiments may use other forms of slides. Further, an alternative embodiment may use any other mechanical arrangement that enables a plurality of vertically orientated slidable field panels to slide out of the housing, including pivoting linkages or other types of brackets that enable objects in a housing to slide out of the housing while remaining in supporting connection with the housing.

In an example embodiment, the rack may include three of the independently slidable field panels that are mounted within an open ended enclosure 158 that is mounted to the frame 156 of the housing 104. Such an enclosure 158 may correspond to a 19" rack standard of 25U (43 inches high, 17 inches wide, 29 inches deep) NEMA Type 1/IEC IP10 (non-sealed) enclosure, conforming to the EIA-310E standard for IT rail hole spacing. However, it should be appreciated that alternative embodiments may use smaller or larger enclosures, and/or any other form factor of an enclosure, bracket, and/or frame that enables a plurality of slidable field panels to be mounted in sliding side-by-side relation in the housing described herein. Further, it should be appreciated that the described enclosure 158 may include a lockable door in addition to or in lieu of a lockable door for the front side opening of the housing. Further, it should be appreciated that the described enclosure 158 may include removeable or removed sides for use where housing 104 includes sides providing at minimum an overall NEMA Type 1/IEC IP10 (non-sealed) enclosure.

The described rack may also include a plurality of components 118 mounted to the vertical walls of the slidable field panels. In other words one (or both) sides of each vertical wall may include components mounted thereto. A slidable field panel may include different sets of components and/or the same sets of components compared to one or more other slidable field panels in the rack. The components may include a plurality of transformers 124, each including a plurality of terminals 126. However it should be appreciated that the terminals of the transformers may not be accessible. For example, such terminals may be located inside a housing of the transformers and may be pre-wired to wires that extend out of an aperture in the housing. Such transformers may correspond to 24 VAC transformers usable to provide power to components of a heating, ventilating, and air conditioning (HVAC) system 144. However, it should be appreciated that alternative embodiments, may include additional and/or alternative transformers depending on the types of components included in the HVAC system and/or any other type of building system that the described rack may be connected to.

The plurality of components 118 may also include a plurality of building control modules 128. Such building control modules may include a plurality of controller modules 130 in operable connection with a plurality of relays 120 and a plurality of input and/or output I/O modules 132. Such relays 120 may correspond to interposing relays including a plurality of terminals 122. Also, each I/O module includes a plurality of terminals 134.

In example embodiments, such building control modules are operable to control and monitor (via signals and electrical power through wires) components of an HVAC system, such as: air handlers 146; chillers 148; dampers 150; temperature, pressure, or other sensors 152, temperature controllers 154) and/or any other type of component employed in a building system. Such other types of building system components, for example, may include heating systems, smoke detectors, automated window shades, and lighting.

For example, such building control modules may include PXC Modular Series of components of the APOGEE automation System for BACnet Networks provided by Siemens Building Technology, Inc., Buffalo Grove, Ill. The described controller module, for example, may correspond to a BACnet building controller, such as a Siemens PXC Modular controller, which is a microprocessor-based multi-tasking platform for program execution and communication or a Siemens PXC Compact controller which includes on board I/O. Such a controller module may be DIN rail mountable and may include a self-forming bus that connects to further building control modules. However, it should be understood that alternative embodiments may use building system controller modules from any Siemens Operating Companies or other manufactures with additional and/or alterative features.

With respect to a Siemens PCX Modular, the building control modules may include: I/O modules that correspond to Siemens TX-I/O modules; power supply modules that correspond to Siemens TX-I/O Power Supplies; relay modules that correspond to Siemens TX-I/O Relays or other modular relay; PXC Modular Expansion Modules; TX-I/O Bus Connection Modules and/or any other modular component that interfaces with the Siemens PCX Modular.

Also it should be appreciated that the described building control modules may include the building control components of other manufactures that are capable of being connected to a building system controller to provide input/output signals, to control relays, and/or to carry out any other type of building technology communications for controlling and monitoring the components of an HVAC system or other building system.

Figure 2:
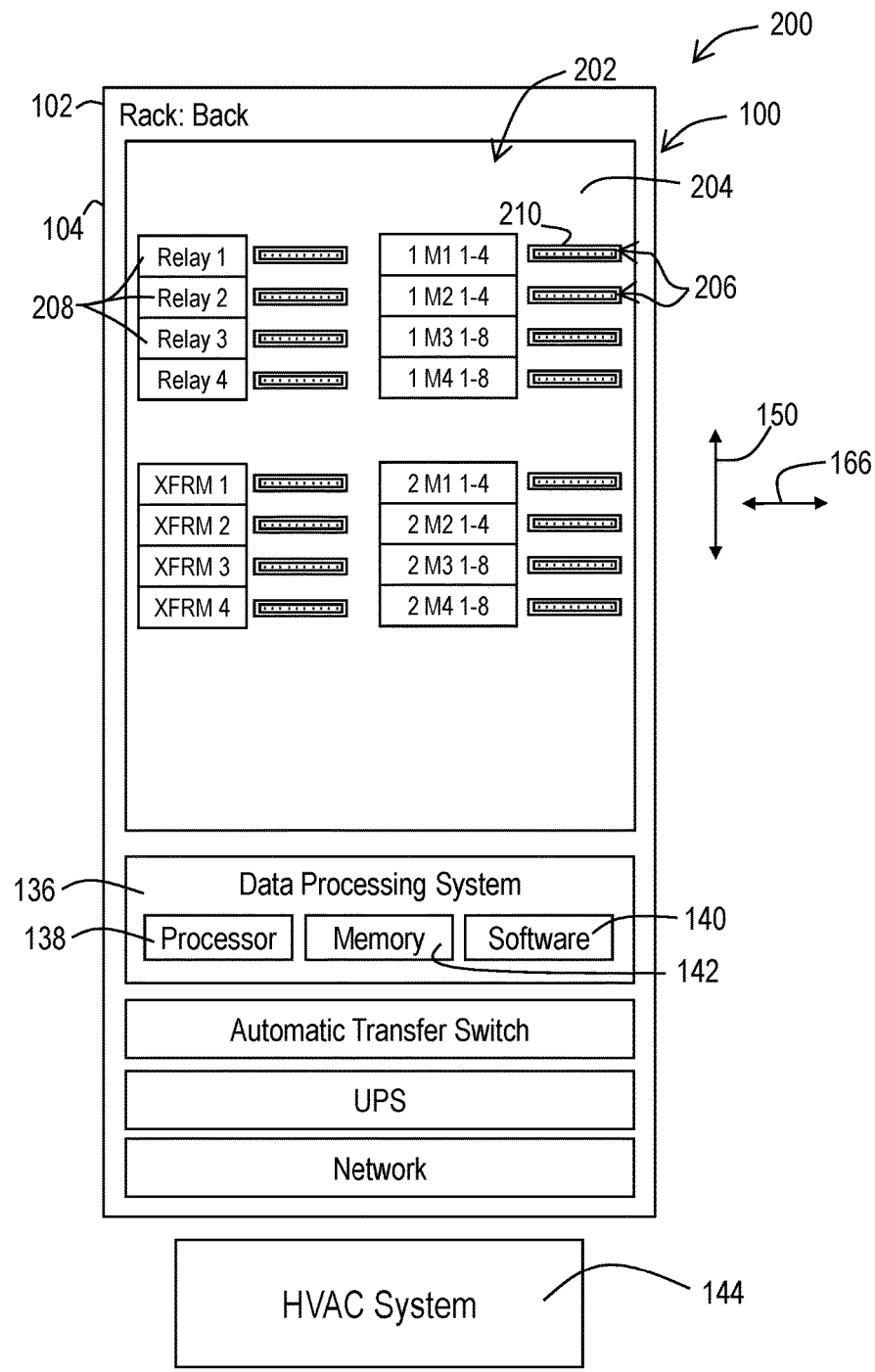
FIG. 2 illustrates a further functional block diagram of the system showing an example back side of the rack.

FIG. 2 illustrates a further functional block diagram of the system 100 showing an example back side 200 of the rack 102 and back side opening 202. In example embodiments, the rack may further include at least one terminal panel 204 including a plurality of connection terminals 206 facing the back side opening. In example embodiments, the connection terminals 206 are respectively wired to respective terminals of the relays, transformers, and I/O modules mounted to the slidable field panels. Such connection terminals may, for example, be provided as part of a plurality of male pluggable terminal blocks 210, or any other form-factor of terminals that enable the quick connection of wires (e.g., via pluggable end connectors for one or more wires) that connect to the components of an HVAC system or other building system. In an example, the at least one terminal panel 204 may be comprised of a plurality of subpanels. Each subpanel may include connection terminals for an associated slideable field panel. Such an arrangement allows for independent installation, removal, or replacement of an individual slideable field panel and associated subpanel from the enclosure 158.

Referring back to FIG. 1, the described system 100 may further include at least one data processing system 136 including at least one processor 138. In an example embodiment, the data processing system 136 may be a rack mounted server and/or workstation that is mounted in the rack. However, it should be understood, that some example systems may include a plurality of the described racks 102 that in combination control an HVAC system or other building system. In such embodiments, the described data processing system 136 may be included in only one of the racks. Also, in some examples, different data processing systems may be employed in multiple racks used in combination to control an HVAC system or other building system.

In an example embodiment, the at least one processor 138 may be configured via at least one application software component 140 executed from a memory 142 to communicate with the plurality of controller modules (on the slidable field panels) to cause the rack (when a HVAC system 144 or other building system is wired to at least some of the connection terminals), to monitor and control the HVAC system or other building system. Examples of data processing systems 136 and associated application software components may include a DESIGO CC 2U DL380 server, a Clarity LC 2U DL380 server, and a WinPM 1U DL360 server.

It should be understood, that at least one processor 138 may be operative to communicate with one or more data stores such as a database (e.g., Oracle, Microsoft SQL Server), hard drive, SSD, memory card, other type of device that stores non-volatile data, application server, and/or any other type of device or system that is operative to provide data to the at least one processor or is operative to store data received from the at least one processor.

Example embodiments of the described rack 102 may also include other components mounted therein, including an automatic transfer switch 160, an uninterruptible power supply (UPS) 162, one or more backup batteries, a network switch 164. Further, to facilitate interacting with the application software component, the rack may include workstation features, such as a monitor, keyboard, mouse that are connected to one or more of the described data processing systems. Such workstation features may be mounted on brackets that enable the monitor, key board, and mouse, for example, to be folded or slid out of the rack so as to be to a person sitting or standing adjacent the front side opening 106 of the rack. Example embodiments of the rack may also include security features such as cameras, access, and/or alarm systems.

In addition, it should be appreciated that the terminal panel 204 may include other terminals and/or ports, such as network ports for reconnecting Ethernet cables and/or any other type of cable that facilitates connecting components on the slidable field panels, the data processing systems, and/or other components mounted in the rack together and to external building systems.

Figure 3:
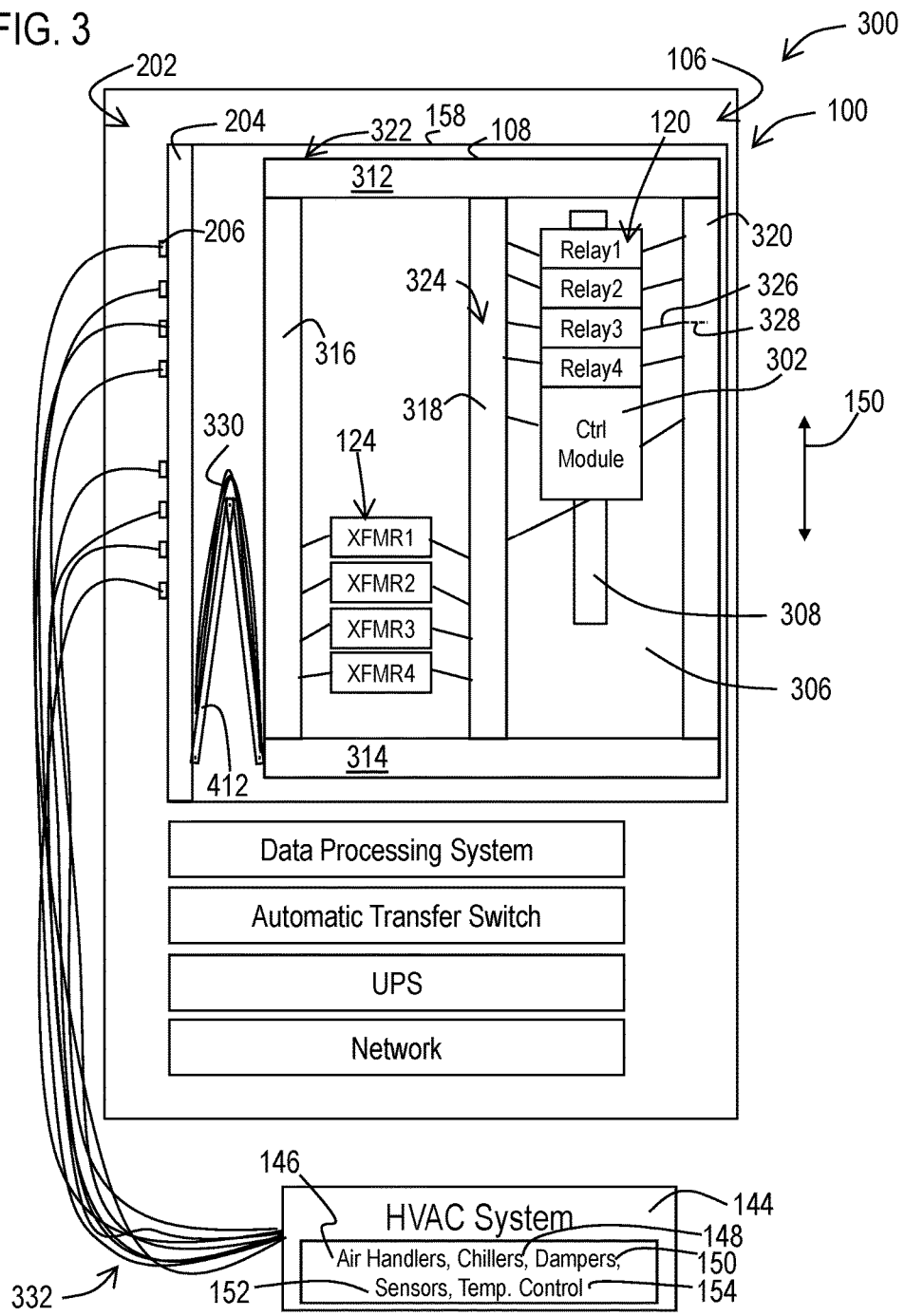
FIG. 3 illustrates a further functional block diagram of the system showing a side cross-sectional view of the rack and a first slidable field panel in a retracted position.

FIG. 3 illustrates a further functional block diagram of the system 100 showing a side cross-sectional view 300 of the rack 102 and one of the slidable field panels 108 in a retracted position. In this example, the field panel 108 may include a plurality of the 24 VAC transformers 124 mounted to a vertical wall 306 of the slidable field panel. Also the slidable field panel 108 may include at least one first controller module 302 and a plurality of relays 120 that are mounted in a vertical direction 150 on a vertical wall 306 in operative connection with a first vertically arranged DIN rail 308 mounted to the first vertical wall 306 of the slidable field panel 108.

In this example, the controller and relays may be connected via integral bus connectors which enable these modules to snap together into an integral unit that is mounted to the vertical rail 308. However, it should be appreciated that alternative embodiments of the modules may be mounted in spaced apart connection on the vertical wall and may be connected together via wires rather than integral bus connectors.

Also, the slidable field panel 108 (and one or more of the other field panels 110, 112) may include, a plurality of perforated cable conduits 312, 314, 316, 318, 320 mounted to the vertical wall along a perimeter 322 of the vertical wall and along a vertical center portion 324 of the vertical wall. The wires 326 extending from the terminals of the components 120, 124 of each slidable field panel may be arranged to extend through perforations 328 in the cable conduit and to be bundled together in at least one bundle 330 of wires that extends out of the cable conduits towards the connection terminals 206 of the terminal panel 204.

Figure 4:
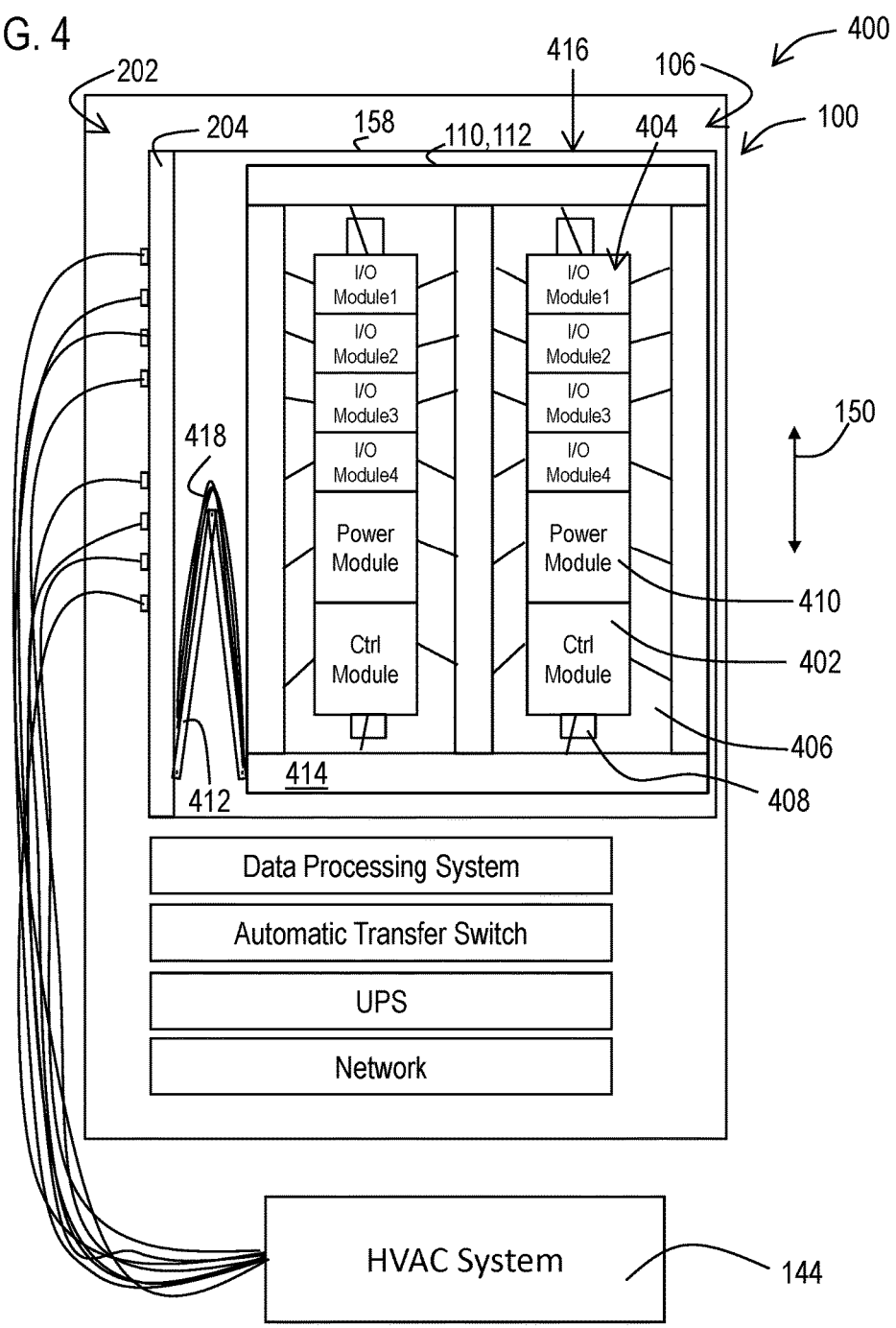
FIG. 4 illustrates a further functional block diagram of the system showing a side cross-sectional view of the rack and a second slidable field panel in a retracted position.

FIG. 4 illustrates a further functional block diagram of the system 100 showing a side cross-sectional view 400 of the rack 102 and a second slidable field panel 110 (or a third slidable field panel 112), which may have the same configuration in this example. Here the second slidable field panel may include a plurality of building control modules including at least one second controller module 402, at least one power supply module 410, and a plurality of I/O modules 404. Such modules may be connected together in the vertical direction 150 on a second vertical wall 406 in operative connection with a second vertically arranged DIN rail 408 mounted to the second vertical wall of the second slidable field panel 110.

As illustrated in FIG. 4, the described rack may include at least one cable carrier 412 in pivoting connection between the terminal panel 204 and each of the slidable field panels 108, 110, 112. The at least one bundle of wires 418 extending from the perforated cable conduits 414 of each slidable field panel may be supported by the at least one cable carrier 412. The cable carriers of each slidable field panel may pivot in vertical directions 150 to cause the bundle of wires 418 supported therewith (or connected thereto via one or bands) to fold together when each respective slidable field panel is slid to a retracted position 416 inside the housing of the rack (as illustrated in FIG. 4).

Figure 5:
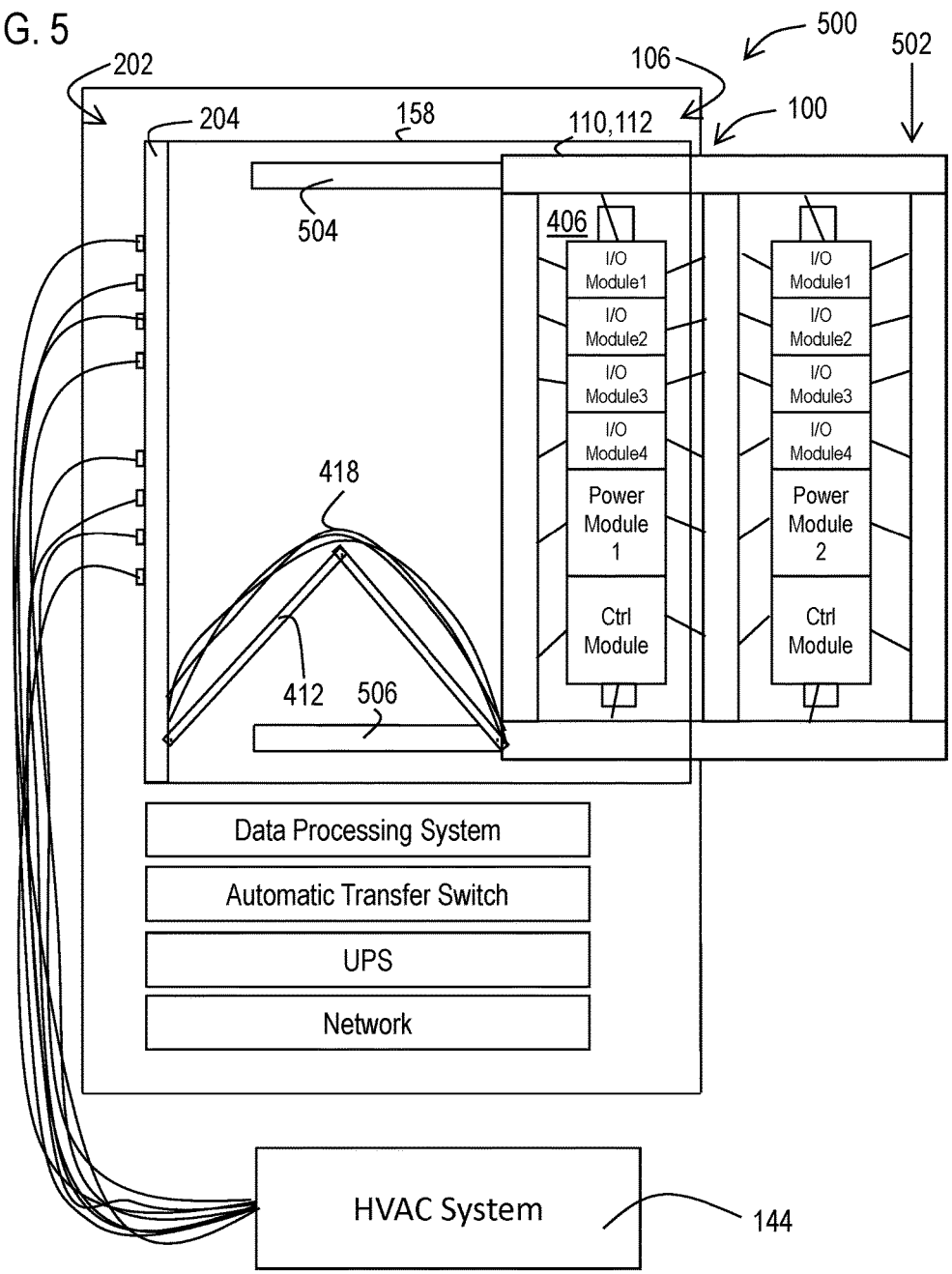
FIG. 5 illustrates a further functional block diagram of the system showing a side cross-sectional view of the rack and the second slidable field panel in a partial extended position.

FIG. 5 illustrates a further functional block diagram of the system 100 showing a side cross-sectional view 500 of the rack 102 in which the second slidable field panel 110 has been slid to a partial extended position 502. In this position, the bundle of wires 418 elongates as the slidable field panel is slid to an extended position at least partially out of the front side opening 106 of the rack.

FIG. 5 also illustrates example locations of two slides 504, 506 mounted to the second vertical wall 406 and portions (e.g., brackets or other support structures) of the slidable field panel enclosure 158. It should also be appreciated that when the second slidable field panel 110 is slid partially out of the rack, the previously described first slidable field panel 108 may be visible between the slides 504, 506. However, in order minimize the complexity of FIG. 5, the details of the first slidable field panel 108 (shown in FIG. 3) are not shown.

Figure 6:
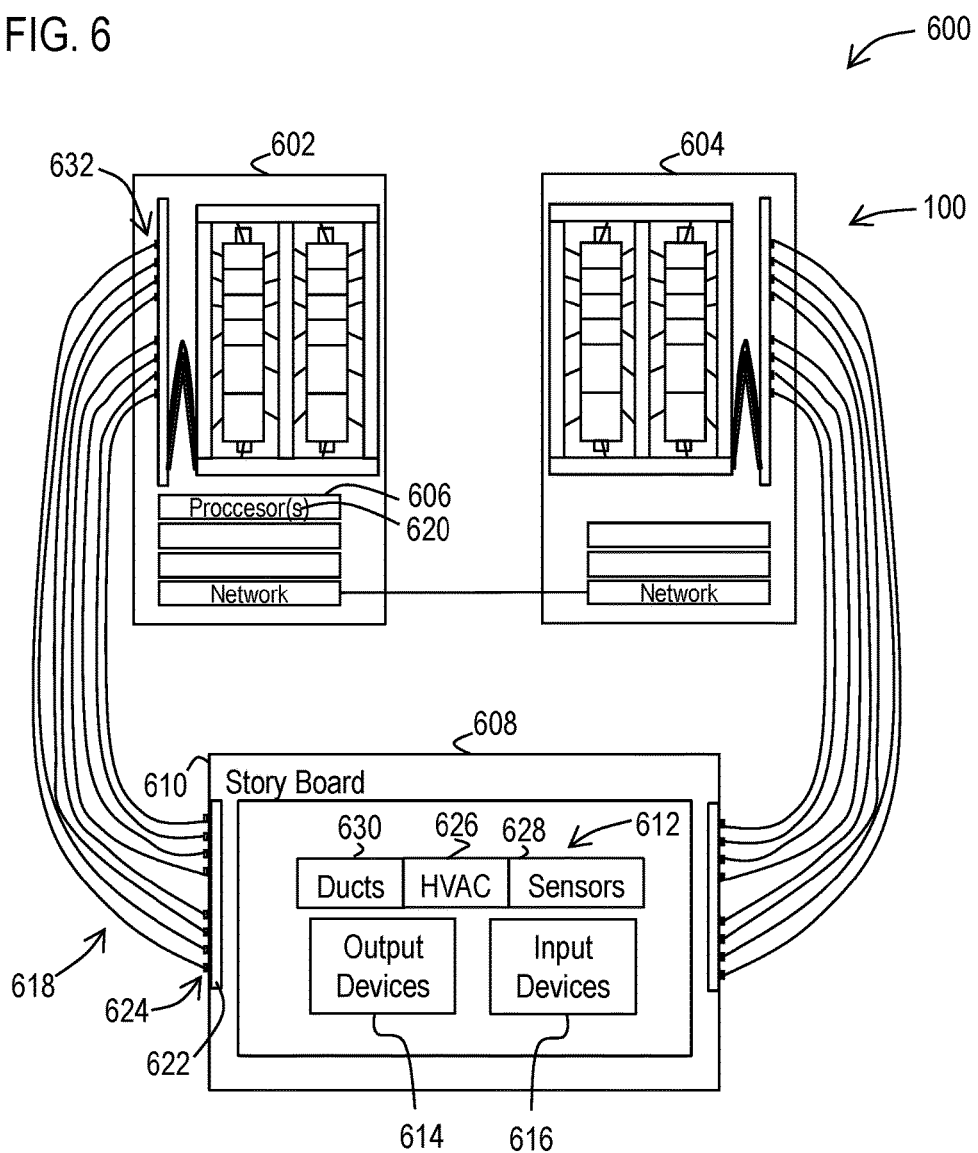
FIG. 6 illustrates a further functional block diagram of a testing system showing a story board connected to two racks.

FIG. 6 illustrates an example of a building control system 100 that includes at least two 602, 604 of the rack 102. In this example, the number and type of components on the slidable field panels that are wired to the connection terminals on the terminal panels in the at least two racks may be identical in each rack. Also, at least one data processing system 606 may be mounted in one of the at least two racks. The at least one processor of the data processing system may be configured via at least one application software component to communicate with the at least one controller module in each of the at least two racks to cause an HVAC system 144 wired to the connection terminals of the at least two racks to be monitored and controlled.

Referring back to FIG. 2, an example embodiment of these racks may include a plurality of labels 208 adjacent to the connection terminals 206. Such labels may uniquely identify each transformer, relay, and I/O module and their respective terminals on the slidable field panels that are wired to the connection terminals of the terminal panel. For example, the slidable field panels generally have components arranged in two vertical columns on each slidable field panel that are separated by a vertical centrally located cable conduit. The labels may thus include indicia which identifies the column that the component is located in (e.g., "1", "2", "3", or "A", "B, "C"), followed by indicia that identifies the component/module in the column (either top to bottom or bottom to top) (e.g., "M1", "M2", "M3") followed by indicia that describes which terminals are included on the component/module are wired to the connection terminals 206 (e.g., "1-4", "5-8", "1-8", "9-16") of a particular terminal block 210.

It should be appreciated that a male pluggable terminal block 210 may be used on the terminal panel 204 that includes a large number of terminals (e.g., such as 12). However, a module connected to the pluggable terminal block 210 may include less than or more than 12 terminals. Thus some connection terminals on a terminal block may be unused. For example, some I/O modules on the field panels may include 8 individual sets of two input/output terminals (for a total of 16 terminals). Thus, in this case, 8 of the terminals on this module may be included on a first terminal block and 8 additional terminals of this module may be included on a second terminal block. Thus corresponding labels for these two connection terminals may reference the same column and the same module numbers, but may reference different sets of the terminals that are wired to the respective terminal block (e.g., "1 M1 1-4" and "1 M1 5-8").

As illustrated in FIG. 3, the plurality of components of the HVAC system may be connected via plug-in wires 332 to the connection terminals 206 of at least one rack that connects to the terminals of the I/O modules, the transformers and the relays mounted to the slidable field panels.

In example embodiments, when a system includes two or more racks with an identical number and type of components on the slidable field panels, the connection terminals 206 and the labels 208 may be arranged generally identically on each rack such as in the same relative locations with respect to each other on the respective terminal panels of the at least two racks. Such an identical arrangement of connection terminals and labels may simplify the complexity of plugging in wires from an HVAC system on two or more racks.

It should also be understood that the arrangement of the components on the described first, second, and third slidable field panels 108, 110, 112, shown in the drawings is just one example. Implementations of the described rack may have a different number and type of components on the slidable field panels, depending on the desired number of transformers, relays, controllers, I/O modules and other components that may be needed for a particular application of the described racks. For example, in one example a rack may include at least three controller modules, at least 18 I/O modules that are controlled via the controller modules and that each include at least 8 I/O terminals, at least 6 transformers, and at least 11 relays.

In another example, a rack may include five controller modules, 36 I/O modules that are controlled via the controller modules and that each includes at least 8-16 I/O terminals, at least 12 transformers, and at least 22 relays.

In this example there may be two vertically orientated (in a longitudinal direction) DIN rails on each of the two slidable field panels (110, 112) with a different controller module on each DIN rail. In addition, there may be two power modules per rail to cover the power requirements of the 9 I/O modules on each rail and any connected field devices. Also, each of the controller modules may be capable of communication with various components using BACnet.

Further in this example one controller module without I/O modules may be located on the vertically orientated (in a longitudinal direction) DIN rail on the third slidable field panel 108. This controller module may be used for integration of various external components using Modbus and/or other communication protocols. The 22 relays 120 are also mounted on this DIN rail are available at the terminals 206 for independent configuration as interposing or interlock relays. Also, the 12 transformers 124 mounted on the third slidable field panel 108 convert line voltage to 24 VAC Class 2 control voltage which may be used locally for controller and relays, or distributed to the terminals 206 to power slidable field panels 110, 112 or external field devices.

Other example embodiments may include other numbers and types of these components. In such an example, the number and type of components on the slidable field panels may be sufficient to control and monitor an HVAC system that includes at least two air handlers 146, at least two chillers 148, at least two dampers 150, and a plurality of temperature and/or pressure sensors 152.

It should also be understood that manufacturing a line or model of racks that are configured generally identically with respect to the number and types of components mounted to the slidable field panels may enable uniformity with respect to software configurations, installation of hardware, and testing that may enhance productivity and lower manufacturing and deployment costs, even in cases where some of the components may not be used for a given application that employs the described racks.

The described racks may be used to replace the use of building control systems mounted to a wall, and thereby eliminate or at least minimize the use of wall space consumed by building control systems. For example, the described rack 102 could be placed in the middle of a data center room along with other racks for other types of data center equipment (e.g., servers, network equipment). The described rack 102 supports the arrangement of three vertically oriented slidable field panels in side-by-side arrangement in a horizontal direction. This allows for the mounting of two relatively long DIN rails in a vertical orientation on one or more of the slidable field panels, which produces a relatively denser arrangement of rail mounted modules (or other components) that are readily accessible for servicing, compared to arrangements of building control modules on individual field panels mounted to a wall. In addition, by using the same standard configuration of a rack for multiple building systems and/or customers, racks may be manufactured, tested and deployed faster than in cases where custom wall mounted field panels are deployed.

It should also be understood that the example system and rack is scalable. For example, should use of an alternative standard be required, such as a 24" rack system then the enclosure 158 could be scaled to support the arrangement of four vertically oriented slidable field panels in side-by-side arrangement in a horizontal direction.

Before the described rack is employed in a building system (by being connected to an HVAC system or other building system), the rack may undergo testing to verify that the application software components and the controller modules of the rack have a configuration that will operate the HVAC system or other building system in the manner intended by the customer for the rack.

FIG. 6 illustrates a further functional block diagram of a testing system 600 that may be used to test a building control system 100 comprised of one or more of the previously described racks 102. In the example, shown in FIG. 6, two racks 602, 604 are shown. However, it should be appreciated that this described testing system may be used for one rack and for more than two racks as well.

The example testing system 600 may further include at least one story board 608, which corresponds to a control panel that enables functionality of a building control system (temporarily connected to the story board 608) to be tested by a user. Such a story board may include a frame 610 that is operative to support the elements of the story board described herein. Such a frame may be mounted to a wall or made otherwise accessible so as to be manipulated by a user testing the building control system 100.

The described story board may further include a schematic illustration 612 of an HVAC system 144 (or other building system) mounted to the frame. Such a schematic illustration may correspond to a drawing on a drawing board such as a planar substrate or wall of the frame (e.g., paper, metal, plastic, wood board) that depicts individual components of the HVAC system 626 (or other building system) that are controlled by the one or more racks (such as a graphical drawing of an air handler, chiller, and damper). In addition, the schematic illustration may depict sensors 628 associated with the HVAC system including temperature sensors and pressure sensors, or other types of sensors deployed in a building system (e.g., smoke detectors, motion detectors, light detectors, sound detectors). The schematic illustration may also depict some of the building system to which the HVAC system is connected to, such as ducts 630, or any other portion of the building, which assists in understanding the manner in which the HVAC system (or other building system) is being deployed in the building.

The example story board 608 may also include a plurality of instruments 614, 616 mounted to the frame (e.g., to the display board of the illustration mounted to the frame). The instruments may be mounted at locations on or through the illustration adjacent to the depicted components of the HVAC system (or other building system) (such as the previously described components of the HVAC system and the temperature and pressure sensors). Such instruments may be configured to receive inputs from and provide outputs to the building control system 100 through wires 618 connected to the connection terminals 632 of the one or more racks, In example embodiments, the instruments of the at least one story board are operative to mimic aspects of an HVAC system in order to test the configuration of the building control system in the at least one rack. For example, the instruments on the at least one story board may include input devices 614 and output devices 616. Such output devices may correspond to lights, meters, and/or graphical displays that provide outputs indicative of the signals received from the building control system (e.g., from the output terminals of the I/O modules and relays). Such input devices may correspond to potentiometers, switches, buttons, or any other electronic device that provides electrical signals corresponding to the types of electrical signals that the HVAC system would provide to the building control system (e.g., to the input terminals of the I/O modules).

In example embodiments of a building system that includes two or more racks, at least one data processing system 606 may be mounted in at least one of the at least two racks that manages the building control modules in the racks. As discussed previously, such a data processing system includes at least one processor 620. The at least one processor may be configured via at least one application software component to communicate with at least one controller module in each of the at least two racks to cause an HVAC system capable of being wired to the connection terminals 632 of the one or more racks to be monitored and controlled. Also, when the story board is connected to the one or more racks, the at least one processor using the same application software components will cause the instruments on the at least one story board to mimic aspects of the HVAC system in order to test the configuration of the building control system.

A user may test the HVAC system using the described story board by manipulating the input devices and then monitoring the output devices for changes to outputs (or a lack thereof). For example, a user may manipulate a potentiometer type of input device that provides a signal representative of a temperature for an I/O module terminal that is configured in the rack to monitor a particular temperature sensor in the HVAC system. Based on an input from the potentiometer input device that is representative of an increase in temperature, the rack may be configured to cause a chiller and air handler to operate. The user may then monitor the output devices to verify that the output signals associated with the operation of the chiller and air handler have changed to an appropriate operational mode. The user may then further adjust the same potentiometer input device to provide an electrical signal that mimics a lower temperature reading for the temperature sensor being mimicked, in order to verify that the rack is properly configured to adjust the operational mode of the chiller and air handler accordingly. In another example, a user may operate an input device on the story board, such as a switch, to indicate a fault with a component and then monitor an output device on the story board to indicate that the fault signal was detected by the rack.

As discussed previously, the number and type of components on the slidable field panels that are wired to the connection terminals on the terminal panels of the two or more racks may be identical in each rack, even though some of the components may go unused for the particular HVAC system or other building system that the racks are configured to control and monitor. Also, the labeling scheme for the connection terminals and the relative locations of the connection terminals on the terminal panels may be identical for the two or more racks in order to reduce the complexity of wiring multiple racks to a story board and/or an HVAC system or other building system.

The story board may also include at least one terminal panel 622 including a plurality of connection terminals 624 that are wired to the instruments 614, 616 of the at least one story board. The connection terminals 624 of the story board 608 may be implemented in a similar manner as the connection terminals of the racks, such as via a plurality of male pluggable terminal blocks.

To wire a story board to at least some of the connection terminals of the racks, a user may plug wires 618 into the connection terminals 624 on the story board and the connection terminals 632 on the racks. To facilitate to connection of the correct wires, the story board may comprise labels (such as the labels 208 of the rack shown in FIG. 2) adjacent the connection terminals 624 on the terminal panel 622 of the story board that identify individual components and their terminals included on the slidable field panels of the racks to which the instruments on the story board are to be connected. Further, such labels on the terminal panel 622 of the story board may specify which rack to connect the wires to, in cases when the building system includes one or more racks (e.g., "Rack1", "Rack2").

Figure 7:
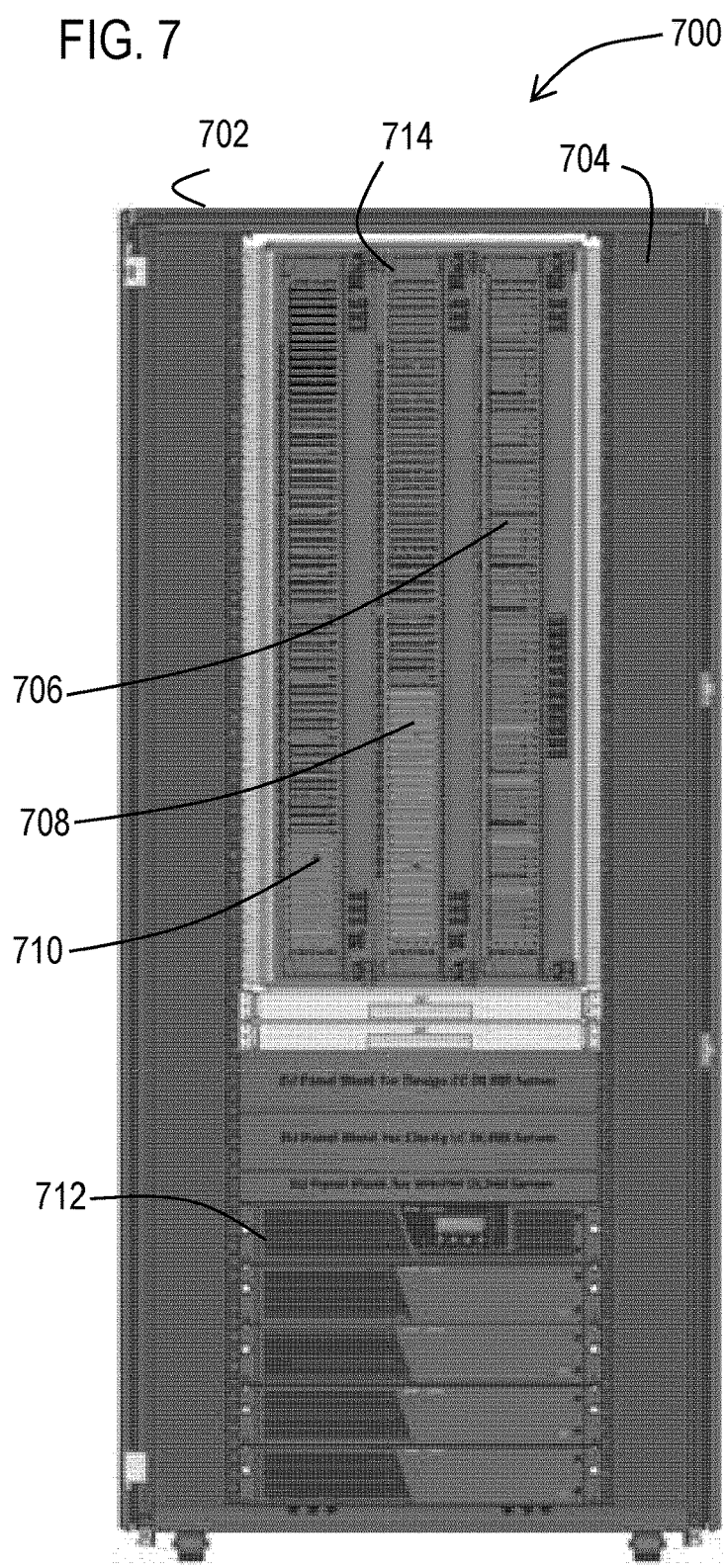
FIGS. 7-10 show various plane and perspective views of example implementation of the rack.
Figure 8:
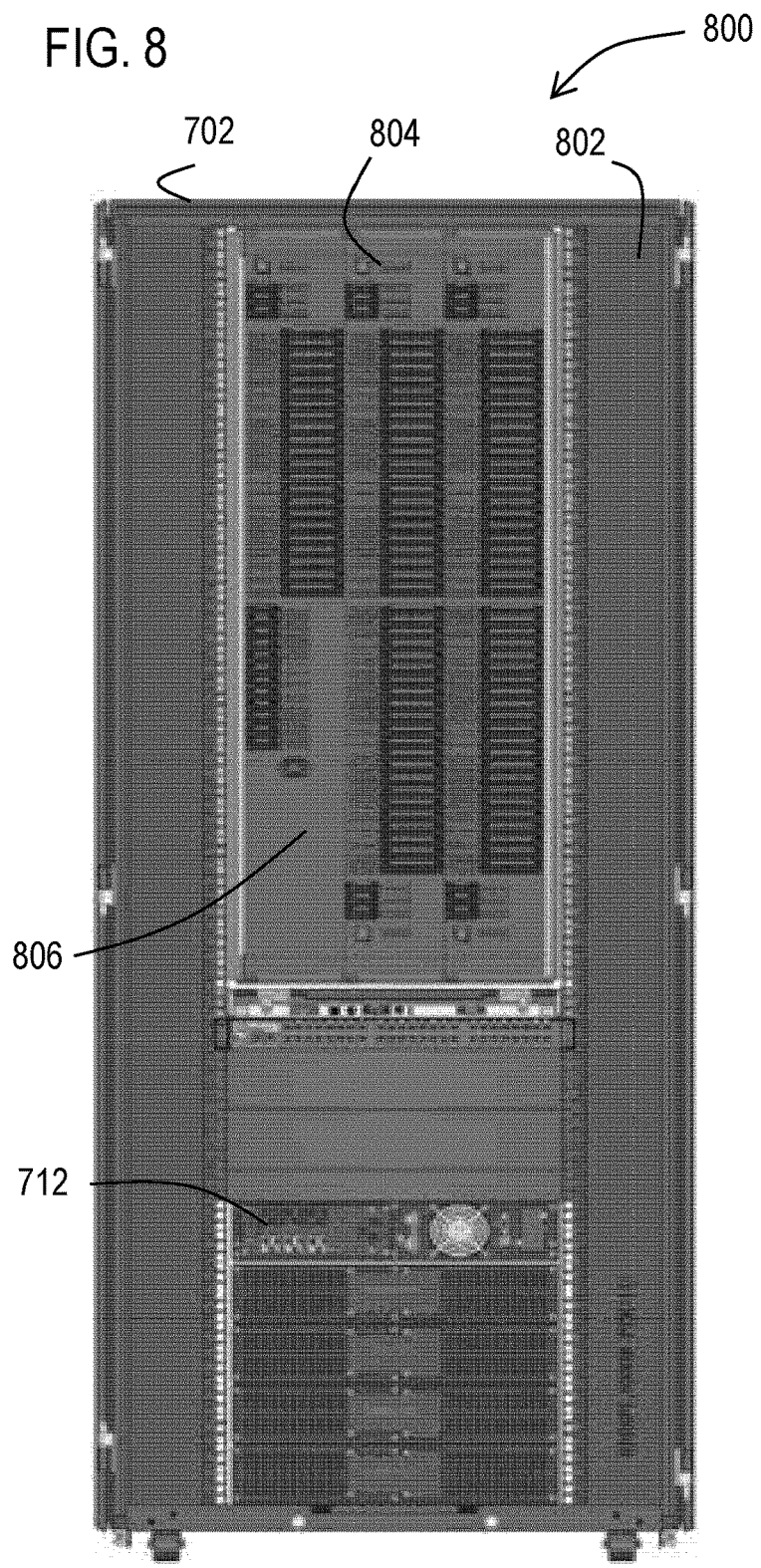

In order to enhance understanding of the various embodiments described herein, FIGS. 7-10 show various plane and perspective views of an example implementation of the rack 102. For example, FIG. 7 shows a front plane view 700 of the rack 702, illustrating a front door 704 having a window 714 through which three slidable field panels 706, 708, 710 are illustrated. FIG. 7 also shows an example of a rack mounted data processing system 712 visible through the window. In addition, FIG. 8, shows a back plane view 800 of the rack 702, illustrating a back door 802 having a window 804 through which a terminal panel 806 is illustrated.

Figure 9:
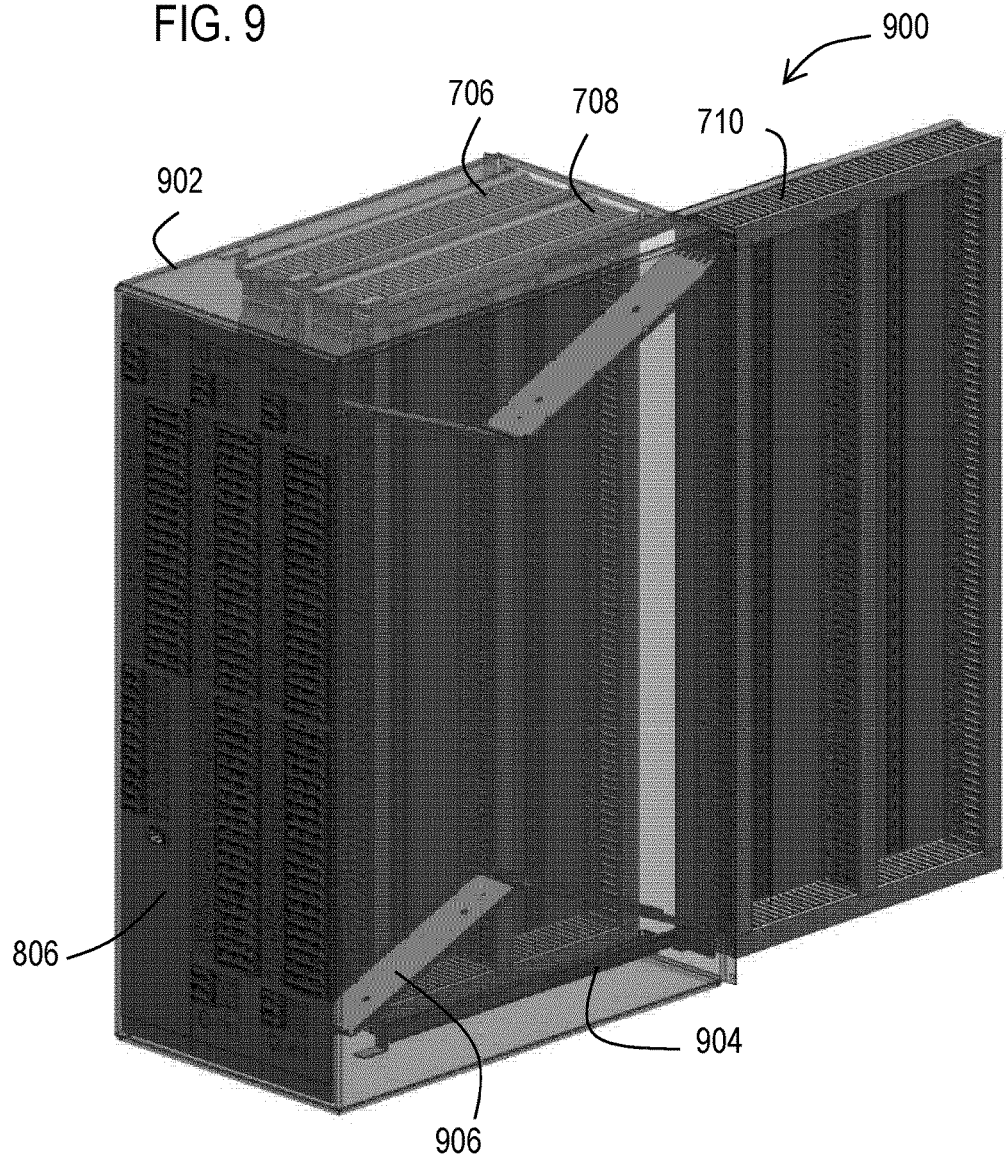

Referring now to FIG. 9, an example perspective view 900 of a slidable field panel enclosure 902 is illustrated in which the three field panels 706, 708, 710 may be mounted in slidable connection via slides 904 mounted to each slidable field panel and the slidable field enclosure. It should be noted that FIG. 9 shows a slidable field panel enclosure 902 outside of the housing of the rack and without wires and components such as building control modules and transformers mounted to the slidable field panels. Also FIG. 9 illustrates one of the slidable field panels 710 in an extended position showing the resulting orientation of two pivoting cable carriers 906 connected between the slidable field panel 710 and the terminal panel 806.

Figure 10:
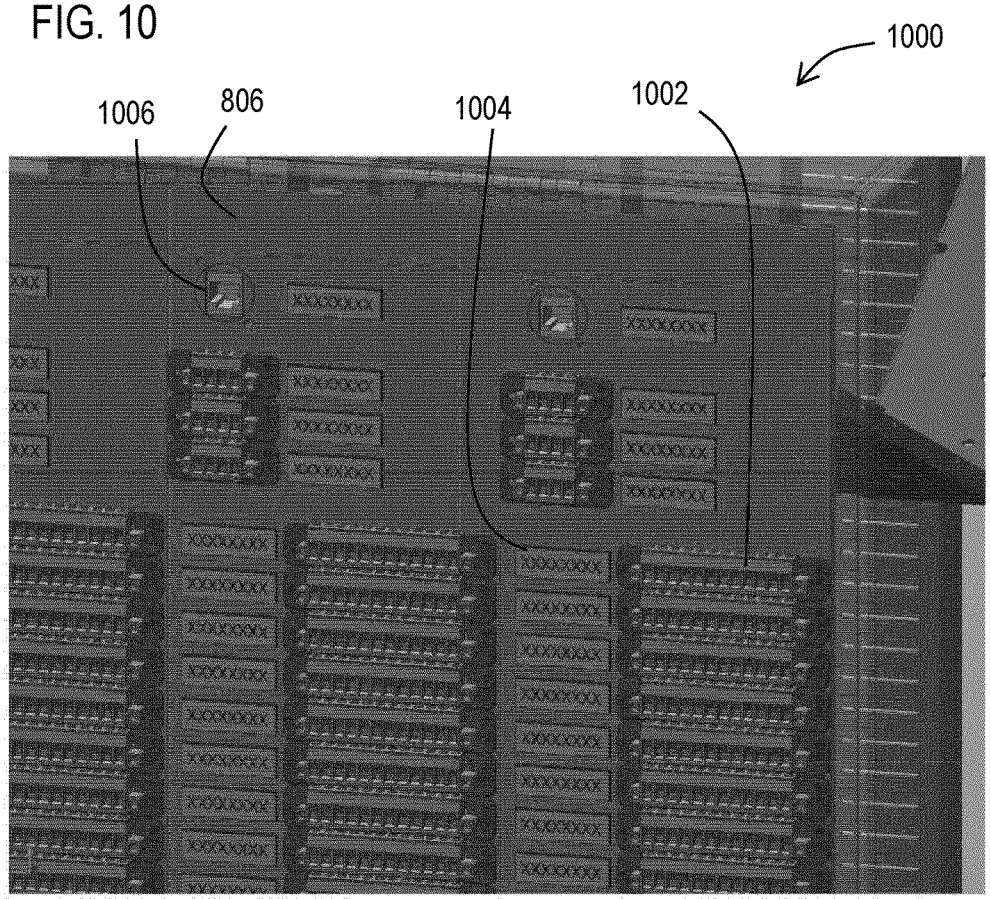

FIG. 10 shows a zoomed in view 1000 of the terminal panel 806 showing a plurality of male pluggable terminal blocks 1002 as well as a plurality of adjacent labels 1004. FIG. 10 also illustrates that the terminal panel may include other types of ports such as a CAT5/6 Ethernet port 1006.

Figure 11:
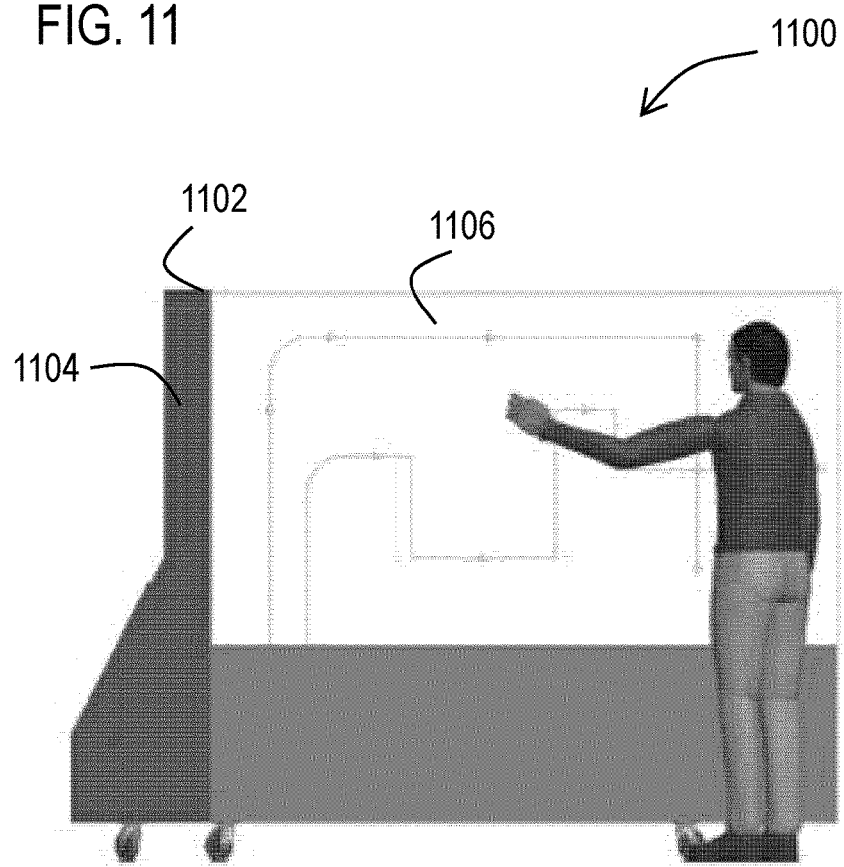
FIG. 11 shows a perspective view of an example implementation of a story board.
Figure 12:
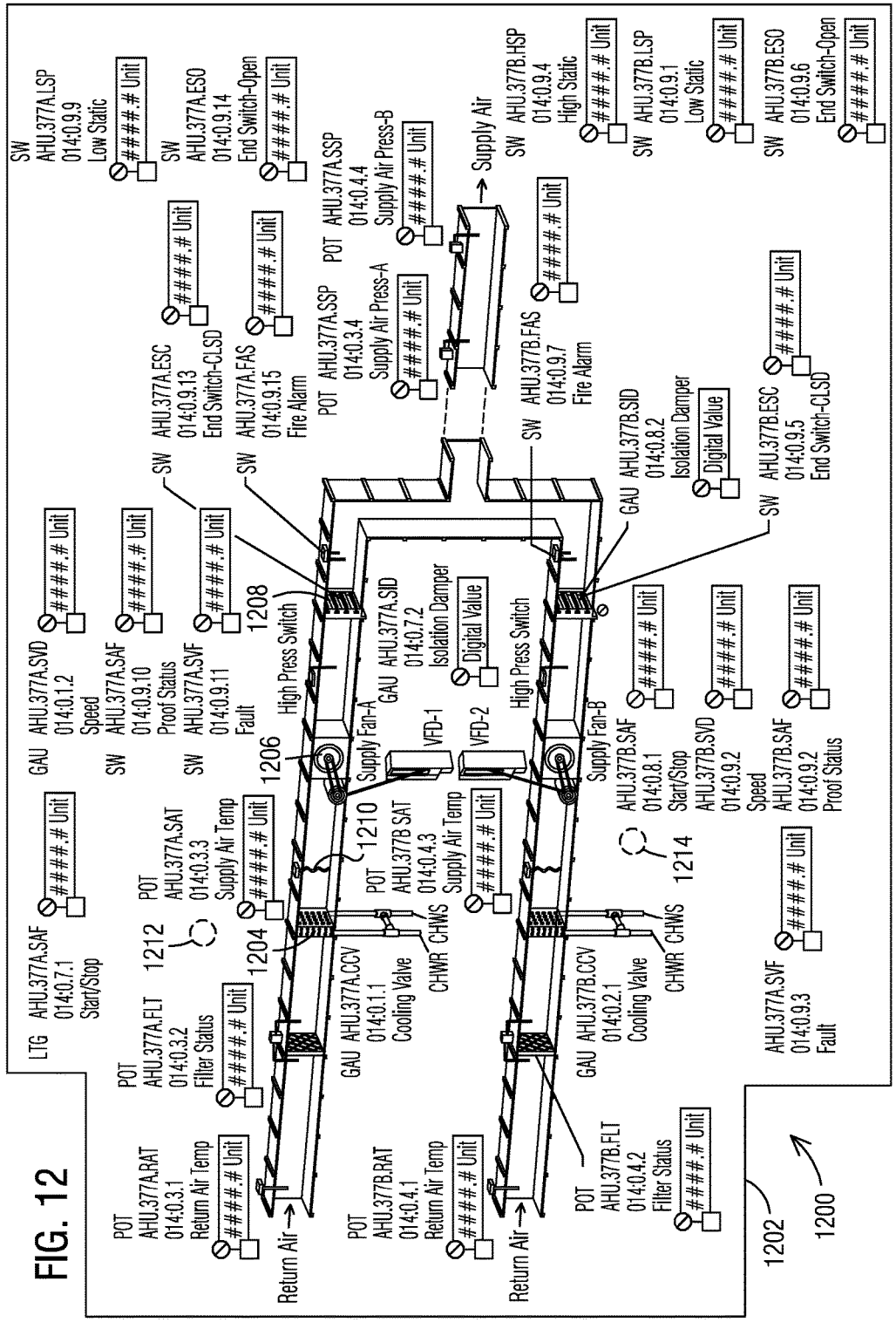
FIG. 12 shows an example of a zoomed in portion of a story board showing an example of a story board illustration.

In order to enhance understanding of the previously described story board, FIG. 11 shows a perspective view 1100 of an example implementation 1102 of the story board 608 schematically illustrated in FIG. 6. As discussed previously, the story board 1102 may include a frame 1104 and an illustration 1106 of an HVAC system (or other building system) mounted thereto. In addition, FIG. 12 shows an example of a zoomed in portion of a story board 1200 showing an example of a story board illustration 1202. The illustration graphically depicts a plurality of HVAC components such as a chiller 1204, air handler 1206, damper 1208, and air temperature sensor 1210. Instruments, (not shown) may be mounted adjacent to the story board adjacent the graphical components and/or adjacent a textual description of the graphical components. For example, schematic circle 1212 illustrates an example location for mounting a potentiometer associated with the depicted air temperature sensor 1210. In addition, schematic circle 1214 illustrates an example location for mounting one or more LEDs that provide an output associated with the start/stop status of the depicted air handler 1206.

Figure 13:
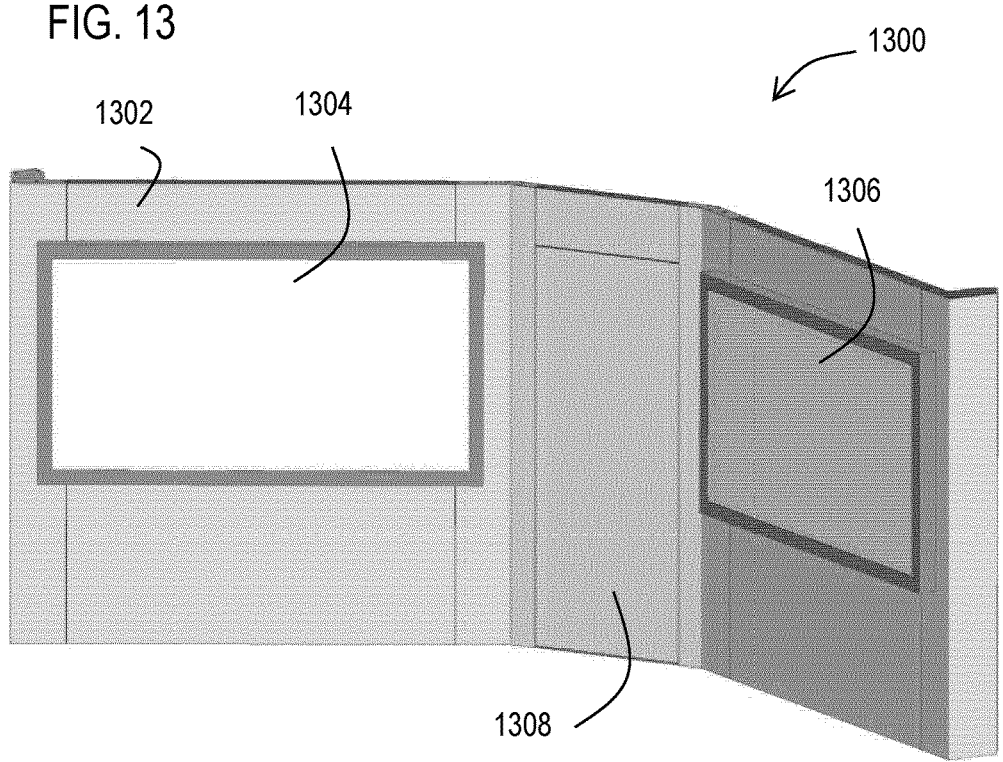
FIG. 13 illustrates an example perspective view of a portable display wall that may be used to display two story boards.

It should be understood that more complex building systems may require more complex building control systems with more racks. Further, testing of more complex building systems may require more than one story board. FIG. 13 illustrates an example perspective view 1300 of a portable display wall 1302 that may be used to display two story boards 1304, 1306. Such a display wall may have an optional door 1308 to provide access to behind the wall in order to access the wiring associated with each story board.

Figure 14:
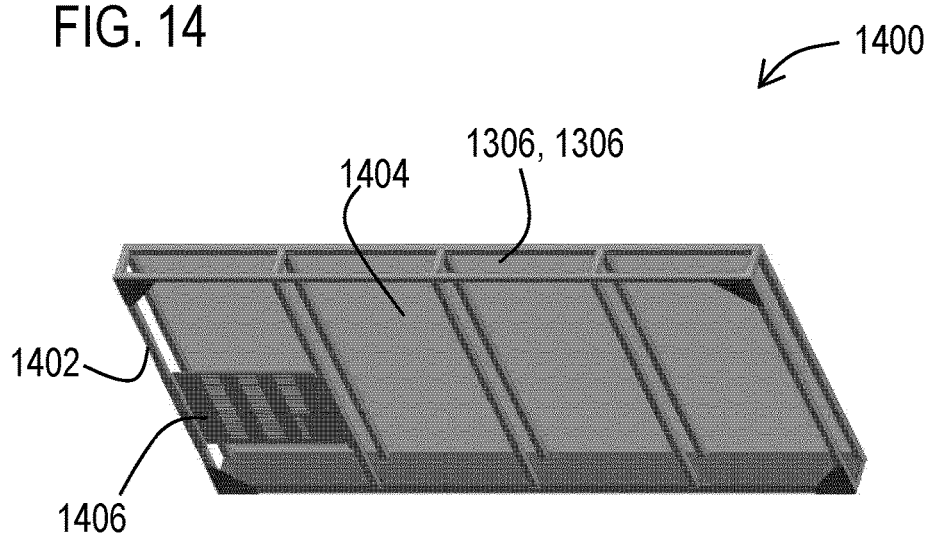
FIG. 14 illustrates a perspective view of a rear side of one of the two story boards shown in FIG. 13.

FIG. 14 illustrates a perspective view 1400 of a rear side of one of the story boards 1304, 1306 shown in FIG. 13. Each story board in this example may include a frame 1402 and a display board 1306 mounted to the frame. The previously described illustration may be printed on the board before it is mounted to the frame. Alternately, the illustration may be included on a paper or plastic substrate that may be mounted to the outside surface of the display board 1404. FIG. 14 also shows an example of a story board terminal panel 1406 mounted to the frame.

In the previous examples, the described components are mounted to vertical walls of the slidable field panels which are in side-by-side relation in a horizontal direction. However, it should also be appreciated that in an alternative embodiment, the described plurality of slidable field panels may be rotated horizontally (with the vertical wall being a horizontal wall) and with the slidable field panels positioned one above the other in the vertical direction. In such an embodiment, the described DIN rails may be mounted to the horizontal walls, and at least some of the described components may be mounted to the rails along the horizontal walls.

Figure 15:
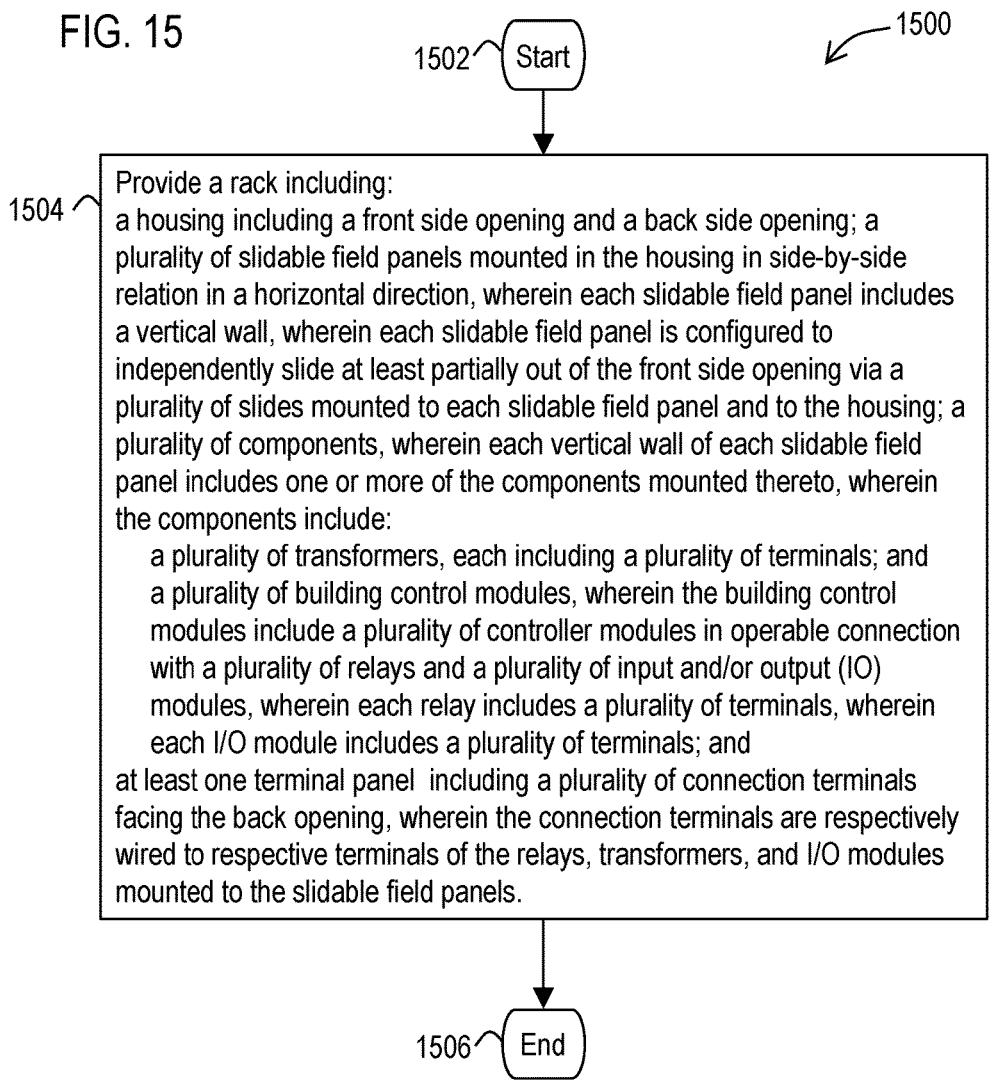
FIG. 15 illustrates a flow diagram of an example methodology that facilitates controlling and monitoring environmental conditions with the rack.

With reference now to FIGS. 15 and 16, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that portions of the mechanism of the present disclosure and/or described acts (such as the described application software component) may be capable of being distributed in the form of computer-executable instructions contained within non-transitory machine-usable, computer-usable, or computer-readable medium in any of a variety of forms, and that the present disclosure applies equally regardless of the particular type of instruction or data bearing medium or storage medium utilized to actually carry out the distribution. Examples of non-transitory machine usable/readable or computer usable/readable mediums include: ROMs, EPROMs, magnetic tape, floppy disks, hard disk drives, SSDs, flash memory, CDs, DVDs, and Blu-ray disks. The computer-executable instructions may include a routine, a sub-routine, programs, applications, modules, libraries, and/or the like. Still further, results of acts of the methodologies may be stored in a computer-readable medium, displayed on a display device, and/or the like.

Referring now to FIG. 15, a methodology 1500 is illustrated that facilitates controlling and monitoring environmental conditions in a building. The methodology may start at 1502 and may include several acts. These acts may include an act 1504 of providing a rack. As discussed previously such a rack may include a housing including a front side opening and a back side opening. The rack may also include a plurality of slidable field panels mounted in the housing in side-by-side relation in a horizontal direction. Each slidable field panel may include a vertical wall. Also, each slidable field panel may be configured to independently slide at least partially out of the front side opening via a plurality of slides mounted to each slidable field panel and to the housing. In addition, the rack may include a plurality of components. Each vertical wall of each slidable field panel may include one or more of the components mounted thereto. Such components may include a plurality of transformers, each including a plurality of terminals. Such components may also include a plurality of building control modules. The building control modules may include a plurality of controller modules in operable connection with a plurality of relays and a plurality of input and/or output (TO) modules. Each relay may include a plurality of terminals. Also, each I/O module may include a plurality of terminals. The rack may further include at least one terminal panel including a plurality of connection terminals facing the back side opening, wherein the connection terminals are respectively wired to respective terminals of the relays, transformers, and I/O modules mounted to the slidable field panels. At 1506 the methodology may end.

It should be appreciated that the methodology 1500 may include other acts and features discussed previously with respect to the building control system 100. For example, the methodology may include an act of configuring at least one data processing system including at least one processor with at least one application software component executable from a memory to communicate with the plurality of controller modules to cause the rack when a heating, ventilating, and air conditioning system is wired to at least some of the connection terminals, to monitor and control the HVAC. Also the methodology may include: an act of wiring the HVAC system to at least some of the connection terminals; and an act of through operation of the at least one processor, causing the rack to monitor and control the HVAC.

Referring now to FIG. 16, a methodology 1600 is illustrated that facilitates testing a building control system that controls and monitors environmental conditions in a building. The methodology may start at 1602 and may include several acts. These acts may include an act 1604 of providing a building control system including at least one rack. The at least one rack may include: a housing; at least one terminal panel mounted in the housing; and a plurality of slidable field panels mounted in the housing in side-by-side relation. The at least one terminal panel may include a plurality of connection terminals that are wired to respective component terminals of a plurality of components mounted to the slidable field panels. Each slidable field panel may be configured to independently slide at least partially out of a front side opening of the housing via a plurality of slides mounted to each slidable field panel and to the housing.

The methodology may also include an act 1606 of providing at least one story board including a frame and a schematic illustration mounted to the frame that depicts components of a heating, ventilating, and air conditioning (HVAC) system. The story board may also include a plurality of instruments mounted to the frame at locations on the illustration adjacent the depicted components of the HVAC system. Such instruments may receive inputs from and provide outputs to the building control system through wires connected to the connection terminals of the at least one rack. Such instruments of the at least one story board may be operative to mimic aspects of an HVAC system in order to test the configuration of the building control system in the at least one rack. The methodology 1600 may also include an act 1608 of connecting the wires between the at least one story board and at least some of the connection terminals of the at least one rack to connect the instruments of the at least one story board to the at least some of the connection terminals of the at least one rack. Further the methodology may include an act 1610 of testing the building control system via the instruments on the at least one story board. At 1612 the methodology may end.

It should be appreciated that the methodology 1600 may include other acts and features discussed previously with respect to the testing system 600. For example, the instruments on the at least one story board may include input devices and output devices that are connected to the connection terminals of the at least one rack via the wires. The act 1610 of testing the building control system may include providing inputs through the input devices that produce electrical signals corresponding to the types of electrical signals that the HVAC system would provide to the building control system. The act 1610 of testing the building control system may also include monitoring outputs from the output devices of the at least one story board that are indicative of the signals received from the building control system.

In addition, the building system may include at least two racks and at least one data processing system may be mounted in at least one of the at least two racks and includes at least one processor. The methodology 1600 may further include an act of configuring the at least one processor with at least one application software component to communicate with at least one controller module in each of the at least two racks to: cause an HVAC system capable of being wired to the connection terminals of the at least two racks to be monitored and controlled; and cause the instruments on the at least one story board to mimic aspects of the HVAC system in order to test the configuration of the building control system in the at least two racks.

As discussed previously, acts associated with these methodologies (other than any described manual acts) may be carried out by one or more processors. Such processor(s) may be included in one or more data processing systems, for example, that execute software components (such as the described application software component) operative to cause these acts to be carried out by the one or more processors. In an example embodiment, such software components may comprise computer-executable instructions corresponding to a routine, a sub-routine, programs, applications, modules, libraries, a thread of execution, and/or the like. Further, it should be appreciated that software components may be written in and/or produced by software environments/languages/frameworks such as Java, JavaScript, Python, C, C#, C++ or any other software tool capable of producing components and graphical user interfaces configured to carry out the acts and features described herein.

FIG. 17 illustrates a block diagram of a data processing system 1700 (also referred to as a computer system) in which an embodiment can be implemented, for example, as a portion of a building system, and/or other system operatively configured by software/firmware or otherwise to perform the processes as described herein. The data processing system depicted includes at least one processor 1702 (e.g., a CPU) that may be connected to one or more bridges/controllers/buses 1704 (e.g., a north bridge, a south bridge). One of the buses 1704, for example, may include one or more I/O buses such as a PCI Express bus. Also connected to various buses in the depicted example may include a main memory 1706 (RAM) and a graphics controller 1708. The graphics controller 1708 may be connected to one or more display devices 1710. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 1712 (Ethernet controllers, WiFi controllers, cellular controllers) operative to connect to a local area network (LAN), Wide Area Network (WAN), a cellular network, and/or other wired or wireless networks 1714 or communication equipment.

Further components connected to various busses may include one or more I/O controllers 1716 such as USB controllers, Bluetooth controllers, and/or dedicated audio controllers (connected to speakers and/or microphones). It should also be appreciated that various peripherals may be connected to the I/O controller(s) (via various ports and connections) including input devices 1718 (e.g., keyboard, mouse, pointer, touch screen, touch pad, drawing tablet, trackball, buttons, keypad, game controller, gamepad, camera, microphone, scanners, motion sensing devices that capture motion gestures), output devices 1720 (e.g., printers, speakers) or any other type of device that is operative to provide inputs to or receive outputs from the data processing system. Also, it should be appreciated that many devices referred to as input devices or output devices may both provide inputs and receive outputs of communications with the data processing system. For example, the processor 1702 may be integrated into a housing (such as a tablet) that includes a touch screen that serves as both an input and display device. Further, it should be appreciated that some input devices (such as a laptop) may include a plurality of different types of input devices (e.g., touch screen, touch pad, and keyboard). Also, it should be appreciated that other peripheral hardware 1722 connected to the I/O controllers 1716 may include any type of device, machine, or component that is configured to communicate with a data processing system.

Additional components connected to various busses may include one or more storage controllers 1724 (e.g., SATA). A storage controller may be connected to a storage device 1726 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 1704 such as a PCI Express bus.

A data processing system in accordance with an embodiment of the present disclosure may include an operating system 1728, software/firmware 1730, and data stores 1732 (that may be stored on a storage device 1726 and/or the memory 1706). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data, which is retrievable by a processor.

The communication controllers 1712 may be connected to the network 1714 (not a part of data processing system 1700), which can be any public or private data processing system network or combination of networks, as known to those of skill in the art, including the Internet. Data processing system 1700 can communicate over the network 1714 with one or more other data processing systems such as a server 1734 (also not part of the data processing system 1700). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 1702 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 1700 in this example may correspond to a controller, computer, workstation, server, PC, notebook computer, tablet, mobile phone, and/or any other type of apparatus/system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

Also, it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device, for example, may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a physical processor of the server.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 1700 may conform to any of the various current implementations and practices known in the art.

Also, it should be understood that the words or phrases used herein should be construed broadly, unless expressly limited in some examples. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example, a processor that is configured to carry out a function/process may correspond to a processor that is executing the software/firmware, which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may also correspond to a processor circuit particularly fabricated or "wired" to carry out the functions or processes (e.g., an ASIC or FPGA design). Further the phrase "at least one" before an element (e.g., a processor) that is configured to carry out more than one function may correspond to one or more elements (e.g., processors) that each carry out the functions and may also correspond to two or more of the elements (e.g., processors) that respectively carry out different ones of the one or more different functions.

In addition, the term "adjacent to" may mean: that an element is relatively near to but not in contact with a further element; or that the element is in contact with the further portion, unless the context clearly indicates otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. A system for controlling and monitoring environmental conditions in a building comprising:
    a rack including:
        a housing including a front side opening and a back side opening;
        a plurality of slidable field panels mounted in the housing in side-by-side relation in a horizontal direction, wherein each slidable field panel includes a vertical wall, wherein each slidable field panel is configured to independently slide at least partially out of the front side opening via a plurality of slides mounted to each slidable field panel and to the housing;
        a plurality of components, wherein each vertical wall of each slidable field panel includes one or more of the components mounted thereto, wherein the components include:
            a plurality of transformers, each including a plurality of terminals; and
            a plurality of building control modules, wherein the building control modules include a plurality of controller modules in operable connection with a plurality of relays and a plurality of input and/or output (I/O) modules, wherein each relay includes a plurality of terminals, wherein each I/O module includes a plurality of terminals; and
        at least one terminal panel including a plurality of connection terminals facing the back side opening, wherein the connection terminals are respectively wired to respective terminals of the relays, transformers, and I/O modules mounted to the field panels.

2. The system according to claim 1, further comprising:
    at least one data processing system, including at least one processor configured via at least one application software component executed from a memory to communicate with the plurality of controller modules to cause the rack when a heating, ventilating, and air conditioning (HVAC) system is wired to at least some of the connection terminals, to monitor and control the HVAC.

3. The system according to claim 2, wherein at least one first controller module and the plurality of relays are connected together in a vertical direction on a first vertical wall in operative connection with a first vertically arranged rail mounted to the first vertical wall of a first slidable field panel, wherein the building control modules include at least one power supply module, wherein at least one second controller module, the at least one power supply module, and a plurality of I/O modules are connected together in the vertical direction on a second vertical wall in operative connection with a second vertically arranged rail mounted to the second vertical wall of a second slidable field panel, wherein the at least one first and second controller modules are a BACnet building controllers.

4. The system according to claim 3, wherein the plurality of slidable field panels include three independently slidable field panels, wherein the rack includes at least three controller modules, at least 18 I/O modules that are controlled via the controller modules and that each include at least 8 I/O terminals, at least 6 transformers, and at least 11 relays.

5. The system according to claim 4, wherein each slidable field panel includes a plurality of perforated cable conduits mounted to the vertical wall along a perimeter of the vertical wall and along a vertical center portion of the vertical wall, wherein wires extending from the terminals of the components of each slidable field panel are arranged to extend through perforations in the cable conduit and to be bundled together in at least one bundle of wires that extends out of the cable conduits towards the at least one terminal panel.

6. The system according to claim 5, further comprising at least one cable carrier in pivoting connection between the at least one terminal panel and each of the slidable field panels, wherein the at least one bundle of wires extending from the perforated cable conduits of each slidable field panel are supported by the at least one cable carrier, wherein the at least one cable carrier of each slidable field panel pivots in vertical directions to cause the at least one bundle of wires supported therewith to fold together when each respective slidable field panel is slid to a retracted position inside the housing of the rack and cause the at least one bundle of wires to elongate when each respective slidable field panel is slid to an extended position at least partially out of the front side opening of the rack.

7. The system according to claim 4, further comprising at least two of the rack, wherein the number and type of components on the slidable field panels that are wired to the connection terminals on the terminal panels in the at least two racks are identical in each rack, wherein the at least one data processing system is mounted in one of the at least two racks, wherein the at least one processor of the data processing system is configured via at least one application software component to communicate with the at least one controller module in each of the at least two racks to cause the HVAC system wired to the connection terminals of the at least two racks to be monitored and controlled.

8. The system according to claim 6, further comprising labels adjacent to the connection terminals, wherein the labels uniquely identify each transformer, relay, and I/O module and their respective terminals on the slidable field panels that are wired to the connection terminals of the terminal panels of the at least two racks, wherein the connection terminals and the labels are arranged in the same relative locations with respect to each other on the respective terminal panels of the at least two racks.

9. The system according to claim 8, further comprising the HVAC system.

10. The system according to claim 9, wherein the HVAC system includes a plurality of components including at least two air handlers, at least two chillers, at least two dampers, a plurality of temperature sensors, and a plurality of pressure sensors, wherein the plurality of components of the HVAC system are connected via wires to at least some of the connection terminals of the at least two racks that connect to the terminals of the I/O modules, the transformers and the relays mounted to the slidable field panels.

11. A method for controlling and monitoring environmental conditions in a building comprising:
providing a rack including:
a housing including a front side opening and a back side opening;
a plurality of slidable field panels mounted in the housing in side-by-side relation in a horizontal direction, wherein each slidable field panel includes a vertical wall, wherein each slidable field panel is configured to independently slide at least partially out of the front side opening via a plurality of slides mounted to each slidable field panel and to the housing;
a plurality of components, wherein each vertical wall of each slidable field panel includes one or more of the components mounted thereto, wherein the components include:
a plurality of transformers, each including a plurality of terminals; and
a plurality of building control modules, wherein the building control modules include a plurality of controller modules in operable connection with a plurality of relays and a plurality of input and/or output (I/O) modules, wherein each relay includes a plurality of terminals, wherein each I/O module includes a plurality of terminals; and
at least one terminal panel including a plurality of connection terminals facing the back side opening, wherein the connection terminals are respectively wired to respective terminals of the relays, transformers, and I/O modules mounted to the slidable field panels.

12. The method according to claim 11, further comprising:
configuring at least one data processing system including at least one processor with at least one application software component executable from a memory to communicate with the plurality of controller modules to cause the rack when a heating, ventilating, and air conditioning (HVAC) system is wired to at least some of the connection terminals, to monitor and control the HVAC;
wiring the HVAC system to at least some of the connection terminals; and through operation of the at least one processor, causing the rack to monitor and control the HVAC.

13. The method according to claim 12, wherein at least one first controller module and the plurality of relays are connected together in a vertical direction on a first vertical wall in operative connection with a first vertically arranged rail mounted to the first vertical wall of a first slidable field panel, wherein the building control modules include at least one power supply module, wherein at least one second controller module, the at least one power supply module, and a plurality of I/O modules are connected together in the vertical direction on a second vertical wall in operative connection with a second vertically arranged rail mounted to the second vertical wall of a second slidable field panel, wherein the at least one first and second controller modules are a BACnet building controllers.

14. The method according to claim 13, wherein the plurality of slidable field panels include three independently slidable field panels.

15. The method according to claim 14, wherein the rack includes at least three controller modules, at least 18 I/O modules that are controlled via the controller modules and that each include at least 8 I/O terminals, at least 6 transformers, and at least 11 relays.

16. The method according to claim 15, wherein each slidable field panel includes a plurality of perforated cable conduits mounted to the vertical wall along a perimeter of the vertical wall and along a vertical center portion of the vertical wall, wherein wires extending from the terminals of the components of each slidable field panel are arranged to extend through perforations in the cable conduit and to be bundled together in at least one bundle of wires that extends out of the cable conduits towards the at least one terminal panel.

17. The method according to claim 16, further comprising at least one cable carrier in pivoting connection between the at least one terminal panel and each of the slidable field panels, wherein the at least one bundle of wires extending from the perforated cable conduits of each slidable field panel are supported by the at least one cable carrier, wherein the at least one cable carrier of each slidable field panel pivots in vertical directions to cause the at least one bundle of wires supported therewith to fold together when each respective slidable field panel is slid to a retracted position inside the housing of the rack and cause the at least one bundle of wires to elongate when each respective slidable field panel is slid to an extended position at least partially out of the front side opening of the rack.

18. The method according to claim 15, wherein the rack corresponds to a first rack, further comprising providing a second rack, wherein the number and type of components on the slidable field panels that are wired to the connection terminals on the terminal panels in the first and second racks are identical in each rack, wherein the at least one data processing system is mounted in one of the first or second racks, wherein configuring the at least one data processing system includes configuring the at least one data processing system with the at least one application software component to communicate with the at least one controller module in each of the first and second racks to cause the HVAC system wired to the connection terminals of the first and second racks to be monitored and controlled.

19. The method according to claim 18, wherein the terminal panels of the first and second racks include labels adjacent to the connection terminals of each rack, wherein the labels uniquely identify each transformer, relay, and I/O module and their respective terminals on the slidable field panels that are wired to the connection terminals of the terminal panels of the first and second racks, wherein the connection terminals and the labels are arranged in the same relative locations with respect to each other on the respective terminal panels of the first and second racks.

20. The method according to claim 19, wherein the HVAC system includes a plurality of components including at least two air handlers, at least two chillers, at least two dampers, a plurality of temperature sensors, and a plurality of pressure sensors,
wherein wiring the HVAC system includes wiring via wires the plurality of components of the HVAC system to at least some of the connection terminals on each of the first and second racks that connect to the terminals of the I/O modules, the transformers and the relays mounted to the slidable field panels of the first and second racks.

* * * * *